United States Patent
Nakayama

(10) Patent No.: US 9,966,238 B2
(45) Date of Patent: May 8, 2018

(54) METHOD FOR MANUFACTURING SEMICONDUCTOR DEVICE, SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventor: Masanori Nakayama, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 419 days.

(21) Appl. No.: 14/669,462

(22) Filed: Mar. 26, 2015

(65) Prior Publication Data

US 2015/0200081 A1    Jul. 16, 2015

Related U.S. Application Data

(63) Continuation of application No. PCT/JP2013/076092, filed on Sep. 26, 2013.

(30) Foreign Application Priority Data

Sep. 26, 2012  (JP) .................. 2012-212131

(51) Int. Cl.
*H01J 37/32* (2006.01)
*H01J 37/34* (2006.01)
(Continued)

(52) U.S. Cl.
CPC .... *H01J 37/32862* (2013.01); *H01J 37/3266* (2013.01); *H01J 37/32871* (2013.01);
(Continued)

(58) Field of Classification Search
CPC ............. H01J 37/3266; H01J 37/32862; H01J 37/32871; H01J 37/32926; H01J 37/3405;
(Continued)

(56) References Cited

U.S. PATENT DOCUMENTS 5,746,928 A * 5/1998 Yen ................... H01J 37/32862
134/1.1
2005/0145170 A1   7/2005 Matsubara et al.
(Continued)

FOREIGN PATENT DOCUMENTS

JP    2004-079664 A    3/2004
JP    2005-197467 A    7/2005
(Continued)

OTHER PUBLICATIONS

Machine translation of JP2010-263244 dated Nov. 2010.*
Japanese Notification of Reasons of Refusal, JP Application No. 2014-538593, dated Dec. 22, 2016, 6 pages (English translation).

*Primary Examiner* — Douglas Lee
(74) *Attorney, Agent, or Firm* — Volpe and Koenig, P.C.

(57) ABSTRACT

Provided is a technique capable of suppressing a product substrate from being contaminated with a contaminant generated in a process chamber. The method includes (a) processing a substrate supported by a first substrate support by generating plasma in a first plasma generating region in a process chamber; and (b) removing a metal substance in the process chamber by generating plasma in the first plasma generating region and a second plasma generating region disposed between the first substrate support and a back surface of a substrate supported by a second substrate support.

16 Claims, 14 Drawing Sheets

(51) Int. Cl.
    *H01L 21/67*      (2006.01)
    *H01L 21/687*     (2006.01)
(52) U.S. Cl.
    CPC .... *H01J 37/32926* (2013.01); *H01J 37/3405*
         (2013.01); *H01J 37/3464* (2013.01); *H01L*
         *21/67069* (2013.01); *H01L 21/6875* (2013.01);
                            *H01L 21/68742* (2013.01)
(58) Field of Classification Search
    CPC .......... H01J 37/3464; H01L 21/67069; H01L
                                  21/68742; H01L 21/6875
    USPC ....................................................... 134/902
    See application file for complete search history.

(56) References Cited

U.S. PATENT DOCUMENTS

2007/0163617 A1* 7/2007 Ozaki ................... B08B 7/0035
                                                            134/1.1
2012/0251723 A1   10/2012 Kishimoto et al.

FOREIGN PATENT DOCUMENTS

| JP | 2008-127644 A  |   | 6/2008  |
| JP | 2010263244 A   | * | 11/2010 |
| JP | 2011-124408 A  |   | 6/2011  |
| WO | 2005/081302 A1 |   | 9/2005  |

\* cited by examiner

METHOD FOR MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. § 119 of Japanese Patent Application No. 2012-212131, filed on Sep. 26, 2012, in the Japanese Patent Office, and International Application No. PCT/JP2013/076092, filed on Sep. 26, 2013, in the WIPO, the whole contents of which are hereby incorporated by reference.

BACKGROUND OF THE INVENTION

1. Field of the Invention

The present invention relates to a substrate processing apparatus for processing a substrate, a substrate processing method or a semiconductor device manufacturing method performed using the substrate processing apparatus, and a non-transitory computer-readable recording medium having recorded thereon a substrate processing program, and more particularly, to a semiconductor device manufacturing method capable of reducing the amount of pollution of a substrate such as a semiconductor wafer (hereinafter referred to simply as a 'wafer') when the substrate is processed by, for example, plasma, a substrate processing apparatus and a non-transitory computer-readable recording medium.

2. Description of the Related Art

For example, in order to improve the reliability of a tunneling insulating film of a flash memory, a silicon oxynitride (SiON) film (hereinafter referred to as an "oxynitride film") is used instead of a silicon oxide (SiO) film (hereinafter referred to as an "oxide film") employed in the related art. Among methods of forming an oxynitride film, a method of forming an oxide film on a surface of a silicon substrate using $N_2O$ gas and introducing nitrogen atoms into an interface between the silicon substrate and the oxide film has been well known. However, as semiconductor devices (devices) are becoming finer, an oxynitride film according to the related art does not satisfy demands for film quality. Thus, a technique of introducing nitrogen atoms into both an interface between the oxynitride film and the silicon substrate and a surface of the oxynitride film by additionally nitridating the surface of the oxynitride film using plasma is used.

Although nitridation performed by plasma is advantageous in terms of selectivity for intensively nitridating a surface of the oxynitride film, low-temperature processing, etc., a substrate may be contaminated by a contaminant (such as heavy metals) contained in components of a process chamber for nitridating the substrate. Although heavy-metal contamination may be decreased by coating the inside of the process chamber with quartz, an alkali metal generated from quartz (particularly, sodium) may cause a serious problem.

Since a back surface of the substrate is in contact with a susceptor on which the substrate is placed in the process chamber, a contaminant may be directly transferred from the susceptor to the substrate and thus the substrate may be easily contaminated. Thus, recently, metal contamination of even a back surface of a substrate has been strictly managed in order to prevent cross-contamination from occurring between substrate processing apparatuses.

For example, in order to decrease an amount of metal contamination, for example, when a device is moved upward, a technique of performing plasma-discharging while supplying nitrogen gas into the process chamber and performing plasma-discharging while supplying oxygen gas into the process chamber in a state in which a product wafer is not placed on the susceptor installed in the process chamber may be used. Also, in order to decrease an amount of metal contamination, for example, when a device is moved upward, a technique of performing plasma-discharging to a higher plasma discharging power level while supplying nitrogen gas into the process chamber prior to a production treatment in a state in which a product wafer is not placed on the susceptor installed in the process chamber than a plasma discharging power level after the production treatment may be used. Also, in order to decrease an amount of metal contamination, a technique of forming a susceptor of a non-metal material such as quartz may be used. However, when these techniques are used, a product substrate cannot be suppressed from or cannot always be sufficiently suppressed from being contaminated from, for example, a contaminant generated from quartz in the process chamber.

SUMMARY OF THE INVENTION

It is an object of the present invention to suppress a product substrate from being contaminated from a contaminant generated in a process chamber.

According to one aspect of the present invention, there is provided a method of manufacturing a semiconductor device, the method including (a) processing a first substrate supported by a first substrate support by generating plasma in a first plasma generating region in a process chamber; and (b) removing a metal substance in the process chamber by generating plasma in the first plasma generating region and a second plasma generating region disposed between the first substrate support and a back surface of a second substrate supported by a second substrate support.

DETAILED DESCRIPTION OF THE PREFERRED EMBODIMENTS

First Embodiment (1) Structure of Substrate Processing Apparatus

Figure 1:
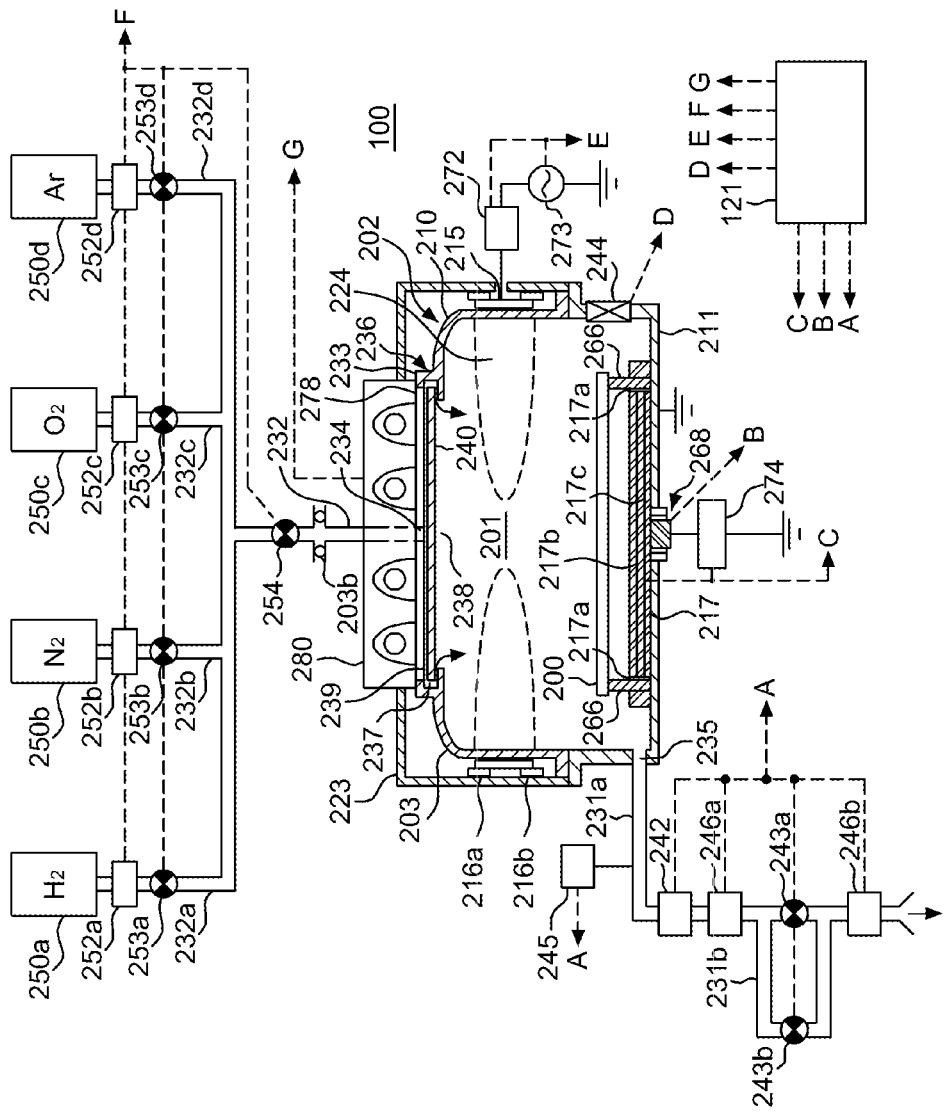
FIG. 1 is a vertical cross-sectional view of a modified magnetron typed (MMT) plasma processing apparatus when a substrate to be processed is loaded therein according to a first embodiment of the present invention.
Figure 2:
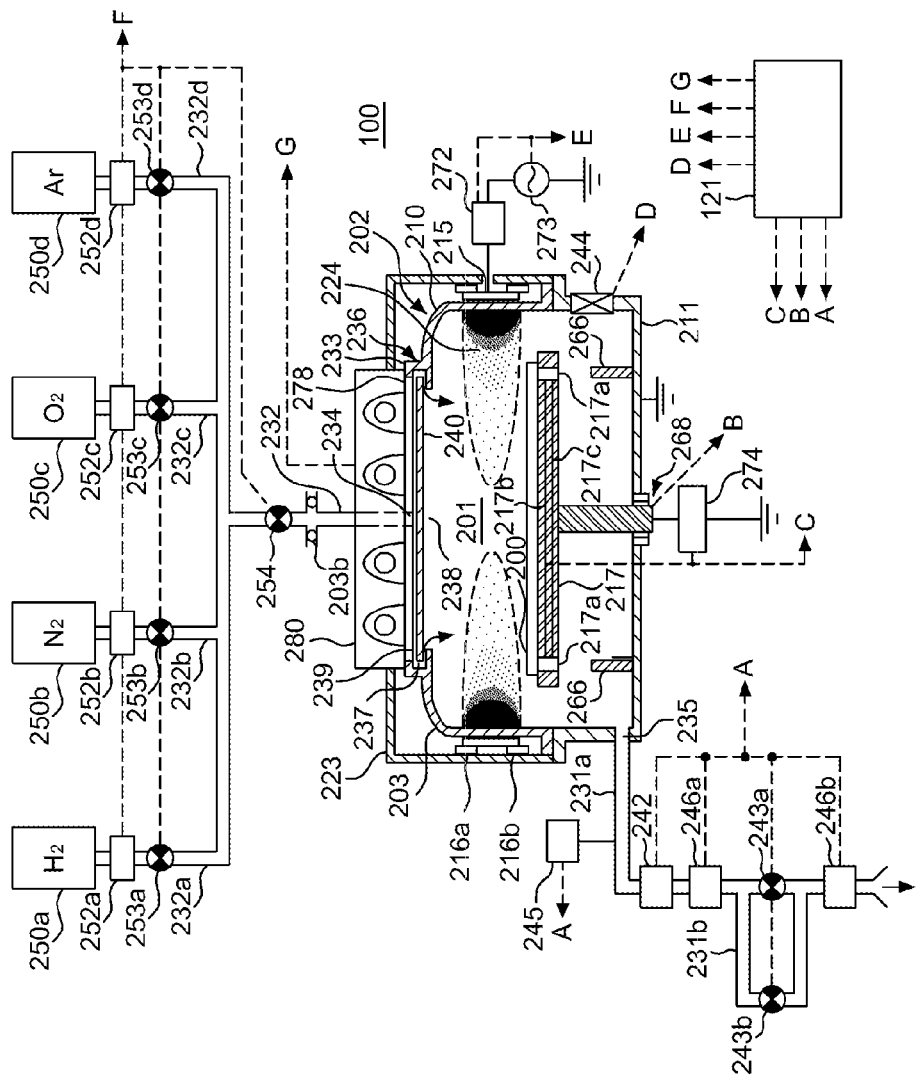
FIG. 2 is a vertical cross-sectional view of the MMT plasma processing apparatus when the substrate is processed according to the first embodiment of the present invention.

A substrate processing apparatus according to a first embodiment of the present invention will be described with reference to FIGS. 1 and 2 below. FIGS. 1 and 2 illustrate a modified magnetron typed (MMT) plasma processing apparatus which is a substrate processing apparatus according to the first embodiment. FIG. 1 is a vertical cross-sectional view of the MMT plasma processing apparatus when a substrate to be processed is loaded therein according to the first embodiment. FIG. 2 is a vertical cross-sectional view of the MMT plasma processing apparatus when the substrate is processed according to the first embodiment.

A substrate processing apparatus according to the first embodiment is an MMT plasma processing apparatus (hereinafter referred to as the "MMT apparatus 100") configured to plasma-process a wafer 200 such as a silicon (Si) substrate using an MMT plasma source that generates high-density plasma from an electric field and a magnetic field. The MMT apparatus 100 is configured to load one wafer 200 into a process chamber 201 maintained in an airtight state and apply a high-frequency voltage to various gases supplied into the process chamber 201 under a predetermined pressure so as to generate a magnetron discharge. The MMT apparatus 100 may perform diffusion such as oxidation or nitridation on the wafer 200 by exciting, for example, a process gas, may form a thin film, or perform various plasma treatments, for example, by etching a surface of the wafer 200.

[Process Chamber]

The MMT apparatus 100 includes a process furnace 202 for plasma-processing the wafer 200. In the process furnace 202, a process container 203 that forms the process chamber 201 is installed. The process container 203 includes a dome type upper container 210 which is a first container and a bowl type lower container 211 which is a second container. The process chamber 201 is formed by placing the upper container 210 onto the lower container 211. For example, the upper container 210 is formed of a non-metal material such as aluminum oxide ($Al_2O_3$) or quartz ($SiO_2$), and the lower container 211 is formed of aluminum (Al). A quartz plate (not shown) is installed at an inner side of the process chamber 201 to prevent metal contamination of the process chamber 201.

A gate valve 244 is installed on a lower sidewall of the lower container 211. The gate valve 244 is configured to load the wafer 200 into the process chamber 201 or unload the wafer 200 from the process chamber 201 via the gate valve 244 using a transfer mechanism (not shown) when the gate valve 244 is open, and is configured to maintain the process chamber 201 in an airtight state when the gate valve 244 is closed.

[Susceptor]

A susceptor 217 is disposed on the center of a bottom side of the process chamber 201 to support the wafer 200 which is a substrate to be processed. The susceptor 217 is formed, for example, a non-metal material such as aluminum nitride (AlN), ceramics or quartz, and is configured to decrease metal contamination of a film formed on the wafer 200.

A heater 217c serving as a heating mechanism is embedded in the susceptor 217 to be integrally formed with the susceptor 217. When power is supplied to the heater 217c, the heater 217c may heat a surface of the wafer 200 to, for example, about 25° C. to 700° C.

[Substrate Potential Changing Unit]

The susceptor 217 serving as a first substrate support is electrically insulated from the lower container 211. An impedance control electrode 217b is installed in the susceptor 217. The impedance control electrode 217b is connected to the ground via an impedance varying mechanism 274 serving as an impedance control unit. The impedance control electrode 217b functions as a second electrode for a container type electrode 215 serving as a first electrode (which will be described below). The impedance varying mechanism 274 includes a coil or a variable condenser, and is configured to control an inductance and resistance of the coil and a capacitance value of the variable condenser so as to control an electric potential (bias voltage) of the wafer 200 via the impedance control electrode 217b and the susceptor 217. As described above, the impedance varying mechanism 274 forms a substrate potential changing unit that changes an electric potential of the wafer 200.

The susceptor 217 is a substrate placement unit and the wafer 200 is placed on the susceptor 217. A susceptor lifting mechanism 268 is installed on the susceptor 217 to move the susceptor 217 up or down. Also, through-holes 217a are installed in the susceptor 217, and wafer lifter pins 266 serving as a second substrate support are installed on a bottom surface of the lower container 211. At least three through-holes 217a and at least three wafer lifter pins 266 are installed to face each other. As illustrated in FIG. 1, when the susceptor 217 is moved down by the susceptor lifting mechanism 268, the wafer lifter pins 266 pass through the through-holes 217a while being not in contact with the susceptor 217 and thus the wafer 200 loaded in the process chamber 201 is temporarily supported by the wafer lifter pins 266. Also, as illustrated in FIG. 2, when the susceptor 217 is moved up by the susceptor lifting mechanism 268, the wafer 200 may be transferred from the wafer lifter pins 266 to the susceptor 217. Also, the wafer lifter pins 266 functions as a substrate support for supporting dummy wafers during a metal removing process which will be described below. A front surface (top surface) of the above substrate placement unit may be substantially planar, and may have at least one emboss or a counterbore thereon. Also, a cover may be installed on the front surface of the substrate placement unit to cover the substrate placement unit. When the substrate placement unit is formed in a complicated structure by installing a counterbore or at least one emboss on the front surface thereof, a metal may be difficult to be removed when a metal removing method according to the related art is used. Thus, a metal may be efficiently removed by performing a metal removing process which will be described below. Although a case in which the susceptor 217 as a first substrate support is moved up or down has been described above, the present invention is not limited thereto and the wafer lifter pins 266 as a second substrate support may be moved up or down or the susceptor 217 and the wafer lifter pins 266 may be moved relative to each other.

[Lamp Heating Unit]

A light transmission window 278 is installed above the process chamber 201, i.e., on a top surface of the upper container 210, and a lamp heating unit 280 serving as a lamp heating device is installed at an external side of the process container 203 on the light transmission window 278. The lamp heating unit 280 is installed at a position facing the susceptor 217, and configured to heat the wafer 200 from above the wafer 200. The wafer 200 may be heated within a shorter time by lighting the lamp heating unit 280 than when the wafer 200 is heated by the heater 217c. Also, the wafer 200 may be heated to 900° C. when both the lamp heating unit 280 and the heater 217c are used.

[Gas Supply Unit]

A gas supply pipe 232 or a shower head 236 is installed above the process chamber 201, i.e., on the upper container 210. The shower head 236 includes a cap type lid 233, a gas inlet 234, a buffer chamber 237, an opening 238, a shielding plate 240 and a gas outlet 239, and is configured to supply various gases into the process chamber 201. The buffer chamber 237 is configured as a diffusion space for diffusing a gas introduced from the gas inlet 234.

A downstream end of a hydrogen-containing gas supply pipe 232a that supplies hydrogen ($H_2$) gas as a hydrogen-containing gas, a downstream end of a nitrogen-containing gas supply pipe 232b that supplies nitrogen ($N_2$) gas as a nitrogen-containing gas, a downstream end of an oxygen-containing gas supply pipe 232c that supplies oxygen ($O_2$) gas as an oxygen-containing gas and a rare gas-containing gas supply pipe 232d that supplies argon (Ar) gas as a rare gas-containing gas are connected to the gas supply pipe 232. An $H_2$ gas source 250a, a mass flow controller (MFC) 252a serving as a flow rate control device and a valve 253a serving as an opening/closing valve are sequentially installed at the hydrogen-containing gas supply pipe 232a from an upstream end. An $N_2$ gas source 250b, an MFC 252b serving as a flow rate control device and a valve 253b serving as an opening/closing valve are sequentially installed at the nitrogen-containing gas supply pipe 232b from the upstream end. An $O_2$ gas source 250c, an MFC 252c serving as a flow rate control device and a valve 253c serving as an opening/closing valve are sequentially installed at the oxygen-containing gas supply pipe 232c from the upstream end. A rare gas-containing gas source 250d, an MFC 252d serving as a flow rate control device and a valve 253d serving as an opening/closing valve are sequentially installed at the rare gas-containing gas supply pipe 232d from the upstream end.

In order to control the concentration of nitrogen in the process chamber 201 or improve an efficiency of nitridating an oxide film on a substrate, hydrogen gas may be used when the oxide film is nitridated while removing chlorine or oxygen in a situation in which a metal film containing impurities such as chlorine or oxygen is formed on the substrate, but may not be used. Also, nitrogen gas is a modifying gas for nitridating the oxide film formed on the wafer 200, and is used as a nitridating gas or an inert gas. Also, the oxygen gas is used to form an oxide film on the wafer 200. When a nitrogen-containing gas, e.g., $NH_3$ gas, which cannot be used as an inert gas is used as a nitridating gas for nitridating the oxide film, an inert gas supply pipe is installed separately from the nitrogen-containing gas supply pipe 232b, and an insert gas source, an MFC and a valve are installed at the inert gas supply pipe.

A valve 254 is installed at a downstream side at which the hydrogen-containing gas supply pipe 232a, the nitrogen-containing gas supply pipe 232b, the oxygen-containing gas supply pipe 232c and the rare gas-containing gas supply pipe 232d meet, and is connected to the gas inlet 234 via a gasket 203b. By opening the valves 253a, 253b, 253c, 253d and 254, a hydrogen-containing gas, a nitrogen-containing gas, an oxygen-containing gas and a rare gas-containing gas may be supplied into the process chamber 201 via the gas supply pipes 232a, 232b, 232c and 232d while the flow rates of these various gases are controlled via the MFCs 252a, 252b, 252c and 252d.

Mainly, a gas supply unit according to the present embodiment includes the gas inlet 234, the gas supply pipe 232, the MFCs 252a, 252b, 252c and 252d and the valves 253a, 253b, 253c, 253d and 254. The shower head 236 (the lid 233, the buffer chamber 237, the opening 238, the shielding plate 240 and the gas outlet 239), the hydrogen-containing gas supply pipe 232a, the nitrogen-containing gas supply pipe 232b, the oxygen-containing gas supply pipe 232c, the $H_2$ gas source 250a, the $N_2$ gas source 250b, the $O_2$ gas source 250c and the rare gas-containing gas source 250d may be further included in the gas supply unit.

[Gas Exhaust Unit]

A gas exhaust port 235 is installed at a sidewall of the lower container 211 to exhaust a gas from the inside of the process chamber 201. An upstream end of a gas exhaust pipe 231a is connected to the gas exhaust port 235. For example, a diaphragm gauge 245 serving as a pressure sensor such as a capacitance manometer is installed at the gas exhaust port 235. The diaphragm gauge 245 is configured to measure pressure, e.g., a maximum pressure of 2 Torr (266 Pa). An auto pressure controller (APC) 242 serving as a pressure adjustor (pressure adjustment unit), a turbo molecule pump 246a serving as a vacuum exhaust device, a main valve 243a serving as an opening/closing valve and a dry pump 246b serving as a vacuum exhaust device are sequentially installed at the gas exhaust pipe 231a from the upstream end.

The APC 242 is an opening/closing valve configured to perform vacuum exhausting or stop exhausting by opening or closing it, and control pressure in the process chamber 201 by adjusting the degree of openness thereof, based on pressure information measured by the diaphragm gauge 245 serving as a vacuum-gauge. Substrate processing using the MMT apparatus 100 is performed, for example, under pressure of 240 Pa or less. When a maximum pressure to be measured by the diaphragm gauge 245 is set to, for example, 2 Torr (266 Pa), the precision of measurement in a pressure region may be improved during substrate processing and high pressure controllability and resolution may be achieved during substrate processing. Although the diaphragm gauge 245 is illustrated here, a Pirani gauge or an ion gauge may be used.

The turbo molecule pump 246a may be, for example, a broadband type. In such case, a maximum pressure at an upstream side of the turbo molecule pump 246a, i.e., at a primary side of the turbo molecule pump 246a, may be 400 Pa.

A gas exhaust pipe 231b forming a slow exhaust line is installed at a downstream side of the turbo molecule pump 246a, i.e., a secondary side of the turbo molecule pump 246a. In detail, an upstream end of the gas exhaust pipe 231b is connected between the turbo molecule pump 246a and the main valve 243a of the gas exhaust pipe 231a. Also, a downstream end of the gas exhaust pipe 231b is connected between the main valve 243a and the dry pump 246b of the gas exhaust pipe 231a. The gas exhaust pipe 231b may be, for example, a ⅜-inch pipe, and a slow exhaust valve 243b is installed as an opening/closing valve.

Mainly, a gas exhaust unit according to the present embodiment includes the gas exhaust port 235, the diaphragm gauge 245, the gas exhaust pipe 231a and the APC 242. The turbo molecule pump 246a, the main valve 243a, the dry pump 246b, the gas exhaust pipe 231b and the slow exhaust valve 243b may be further included in the gas exhaust unit.

[Excitation Unit]

Next, a plasma generation unit serving as an excitation unit will be described below. The container type electrode 215 is installed on an outer circumference of the process chamber 201, i.e., an external sidewall of the upper container 210, to surround the process chamber 201. The container type electrode 215 is formed in a container shape, e.g., a cylindrical shape. The container type electrode 215 is connected to a high-frequency power source 273 which supplies high-frequency power of, for example, a frequency of 13.56 MHz, via a matching device 272 that performs impedance matching.

Upper magnets 216a and lower magnets 216b are installed on a top end and a bottom end of an external surface of the container type electrode 215, respectively. All the upper and lower magnets 216a and 216b include permanent magnets formed in a container shape, e.g., a cylindrical shape. The upper magnet 216a and the lower magnet 216b are arranged such that one magnetic pole thereof faces the process chamber 201 and the other magnetic pole faces the opposite direction. The upper magnet 216a and the lower magnet 216b are also arranged such that the magnetic poles of the upper magnet 216a are in opposite direction to those of the lower magnet 216b. Thus, a magnetic line of force is formed along inner surfaces of the container type electrode 215 in a direction of a cylindrical axis.

A magnetic field is generated by the upper and lower magnets 216a and 216b and an electric field is generated by supplying various gases into the process chamber 201 and supplying high-frequency power to the container type electrode 215 so as to generate magnetron discharge plasma in a first plasma generating region 224 in the process chamber 201 as illustrated in FIG. 2. When emitted electrons make an orbital movement due to the electric field and the magnetic field described above, a rate of electrolytic dissociation of plasma may be improved and the lifetime and density of plasma may be increased.

A metal type shielding plate 223 is installed in the vicinity of the container type electrode 215, the upper magnet 216a and the lower magnet 216b to effectively block an electric or magnetic field generated by the container type electrode 215, the upper magnet 216a and the lower magnet 216b, so that other devices or an external environment may not be negatively influenced by the electric or magnetic field. Mainly, the plasma generation unit serving as an excitation unit includes the first electrode, matching device 272, the high-frequency power source 273, the upper magnet 216a and the lower magnet 216b.

[Control Unit]

A controller 121 serving as a control unit is configured to control various components (the gas supply unit, the gas exhaust unit or the excitation unit) of the substrate processing apparatus 100. The controller 121 is configured to control the diaphragm gauge 245, the APC 242, the turbo molecule pump 246a, the dry pump 246b, the main valve 243a and the slow exhaust valve 243b via a signal line A; control the susceptor lifting mechanism 268 via a signal line B; control the heater 217c and the impedance varying mechanism 274 via a signal line C; control the gate valve 244 via a signal line D; control the matching device 272 and the high-frequency power source 273 via a signal line E; control the MFCs 252a, 252b and 252c and the valves 253a, 253b, 253c and 254 via a signal line F; and control the lamp heating unit 280 via a signal line G.

Figure 5:
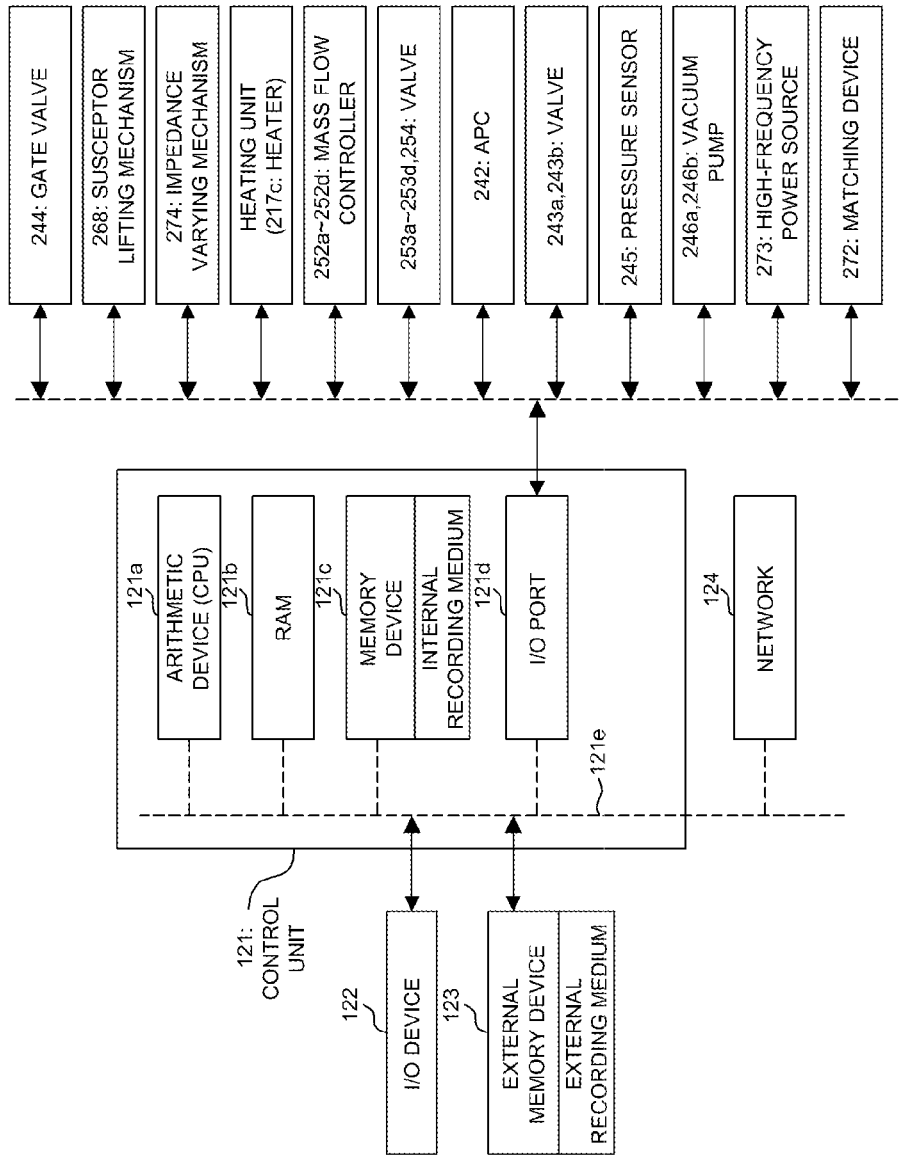
FIG. 5 is a block diagram of a controller according to the first embodiment of the present invention.

FIG. 5 is a block diagram of a controller according to the first embodiment of the present invention. Referring to FIG. 5, the controller 121 which is a control unit (control means) is configured as a computer that includes a central processing unit (CPU) 121a which is an arithmetic unit, a random access memory (RAM) 121b, a memory device 121c and an input/output (I/O) port 121d. The RAM 121b, the memory device 121c and the I/O port 121d are configured to exchange data with the CPU 121a via an internal bus 121e. The controller 121 is configured to be accessible by, for example, an I/O device 122 that includes a mouse, a keyboard and a display or that is embodied as a touch panel, etc. The I/O device 122 may be integrally formed with the controller 121.

The memory device 121c includes, for example, a flash memory, a hard disk drive (HDD), etc. In the memory device 121c, a control program for controlling an operation of the substrate processing apparatus 100, a process recipe including an order or conditions of substrate processing which will be described below, etc. are stored to be readable. The process recipe is a combination of sequences of a substrate processing process which will be described below to obtain a desired result when the sequences are performed by the controller 121, and acts as a program. Hereinafter, the process recipe, the control program, etc. will also be referred to together simply as a "program." When the term "program" is used in the present disclosure, it should be understood as including only the process recipe, only the control program or both of the process recipe and the control program. The RAM 121b is configured as a memory area (work area) in which a program or data read by the CPU 121a is temporarily stored. Also, the program may be recorded on an internal recording medium installed in the memory device 121c, or a program recorded on an external recording medium in an external memory device 123 may be overwritten to the program recorded on the internal recording medium.

The I/O port 121d is connected to various components of the substrate processing apparatus 100, e.g., the MFCs 252a, 252b and 252c, the valves 253a, 253b, 253c and 254, the pressure sensor 245, the APC 242, the vacuum exhaust devices 246a and 246b, the heater 217c and a temperature sensor (not shown), and controls operations of these components or receives information regarding operational states of these components.

The CPU 121a is configured to read a process recipe from the memory device 121c according to a manipulation command, etc. which is input via the I/O device 122 while reading and executing a control program stored in the memory device 121c. Also, based on the read process recipe, the CPU 121a is configured to control the flow rates of various gases using the MFCs 252a, 252b and 252c; control opening/closing of the valves 253a, 253b, 253c and 254; control opening/closing of the APC 242 and pressure adjustment using the APC 242, based on the pressure sensor 245; control temperature adjustment using the heater 217c based on the temperature sensor; and control driving and stopping of the vacuum exhaust devices 246a and 246b.

The controller 121 is not limited to a dedicated computer and may be configured as a general-purpose computer. For example, the controller 121 according to the present embodiment may be configured by providing the external memory device 123 storing a program as described above, e.g., a magnetic tape, a magnetic disk (e.g., a flexible disk, a hard disk, etc.), an optical disc (e.g., a compact disc (CD), a digital versatile disc (DVD), etc.), a magneto-optical (MO) disc or a semiconductor memory (e.g., a Universal Serial Bus (USB) memory, a memory card, etc.), and then installing the program in a general-purpose computer using the external memory device 123. Also, a means for supplying the program to a computer is not limited to using the external memory device 123. For example, the program may be supplied to a computer using a communication means, e.g., the Internet 124 or an exclusive line, without using the external memory device 123. The memory device 121c or the external memory device 123 may be configured as a non-transitory computer-readable recording medium. Hereinafter, the memory device 121c and the external memory device 123 may also be referred to together simply as a "recording medium." When the term "recording medium" is used in the present disclosure, it may be understood as only the memory device 121c, only the external memory device 123 or both of the memory device 121c and the external memory device 123.

[Substrate Transfer Chamber]

Also, in the MMT apparatus 100, a substrate transfer chamber (not shown) is installed to be adjacent to the process chamber 201 via the gate valve 244. A transfer mechanism is installed in the substrate transfer chamber, and the substrate transfer chamber is configured to load a substrate into or unload a substrate from the process furnace 202. Temperature in the substrate transfer chamber is maintained at room temperature and under pressure of 0.1 Pa to 266 Pa, e.g., about 100 Pa, and configured to prevent particles from being scattered due to an operation of the transfer mechanism even when the particles are generated in the substrate transfer chamber.

(2) Substrate Processing Process

Figure 6:
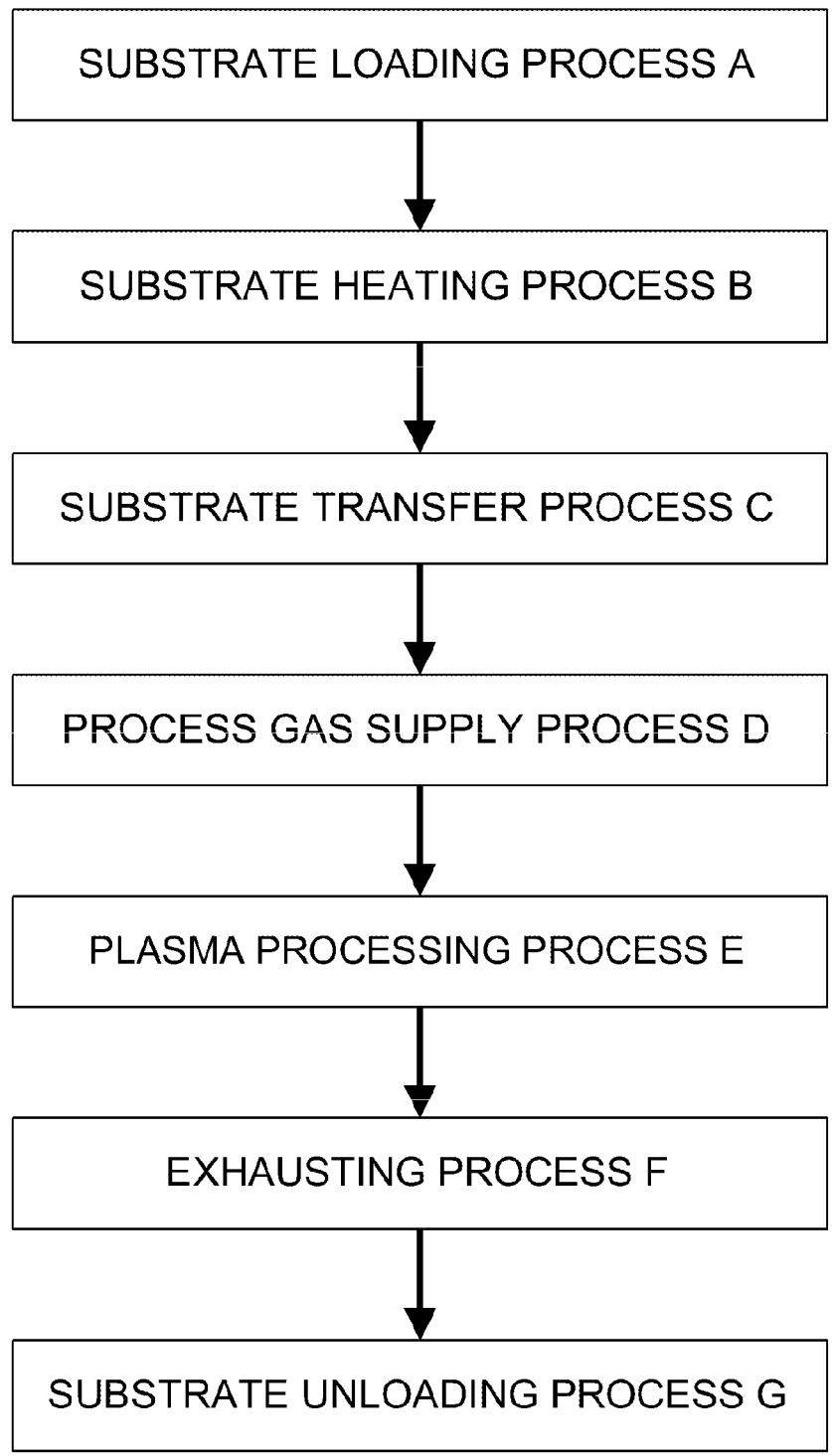
FIG. 6 is a flowchart of a substrate processing process according to the first embodiment of the present invention.

Next, a substrate processing process performed using the substrate processing apparatus 100 according to the first embodiment will be described with reference to FIG. 6 below. The substrate processing process according to the present embodiment includes a product substrate processing process (a main processing process) of processing a substrate to be processed and, for example, a metal removing process using a dummy substrate instead of the substrate to be processed. The substrate processing process is, for example, one process of a semiconductor device manufacturing process and is performed by the MMT apparatus 100 described above. In the product substrate processing process, nitridation is performed as a modifying process on an oxide film formed on a substrate (product substrate) that is to be processed to manufacture semiconductor chips, e.g., the wafer 200 formed of silicon (Si). In the following description, operations of various components of the MMT apparatus 100 are controlled by the controller 121.

(2-1) Main Substrate Processing Process

First, the product substrate processing process which is a main processing process will be described. The product substrate processing process includes a substrate loading process A, a substrate heating process B, a substrate transfer process C, a process gas supply process D, a plasma processing process E, a exhausting process F and a substrate unloading process G which will be described below.

[Substrate Loading Process A]

First, the inside of the process chamber 201 is set to have a pressure, e.g., 100 Pa, that is substantially the same as pressure (e.g., 50 Pa to 300 Pa) in the substrate transfer chamber, and the wafer 200 on which an oxide film is formed is loaded into the process chamber 201 from the substrate transfer chamber. In detail, pressure control is performed by supplying an inert gas, e.g., N₂ gas, to the wafer 200 and for processing performed on the wafer 200 while the inside of the process chamber 201 is vacuum-exhausted using the turbo molecule pump 246a and the dry pump 246b. Next, the susceptor 217 is moved down to a wafer transfer position so that the wafer lifter pins 266 may pass through the through-holes 217a of the susceptor 217. As a result, the wafer lifter pins 266 protrude by a predetermined height, e.g., about 0.5 mm to 3.0 mm, from a top surface of the susceptor 217. Then, the gate valve 244 is opened and the wafer 200 is loaded from the substrate transfer chamber adjacent to the process chamber 201 into the process chamber 201 using the transfer mechanism. Thus, the wafer 200 is supported in a horizontal posture on the wafer lifter pins 266 protruding from the top surface of the susceptor 217. After the wafer 200 is loaded into the process chamber 201, the transfer mechanism is withdrawn to the outside of the process chamber 201, the gate valve 244 is closed and the inside of the process chamber 201 is airtightly blocked.

Electric power is supplied beforehand to the heater 217c, and thus the heater 217c and the susceptor 217 are heated to a temperature that is, for example, in a range of 25° C. to 700° C. Here, when the loaded wafer 200 is rapidly transferred on the susceptor 217, a surface of the wafer 200 that is in contact with the susceptor 217 may be easily heated and thus the speeds of heating the surface of the wafer 200 and a surface thereof opposite the surface are different. As a result, the wafer 200 may be distorted due to the difference between thermal expansion coefficients of both surfaces of the wafer 200. The wafer 200 may be distorted, for example, when a set heater temperature exceeds 700° C. Thus, in the present embodiment, a substrate heating process which will be described below is performed to suppress distortion of the wafer 200 before the wafer 200 is transferred to the susceptor 217.

[Substrate Heating Process B]

In the substrate heating process, the wafer 200 loaded in the process chamber 201 is heated. In detail, the wafer 200 is transferred and supported above the susceptor 217, which is heated to, for example, a range of 25° C. to 900° C., via the wafer lifter pins 266. Also, the inside of the process chamber 201 is exhausted using the turbo molecule pump 246a and the dry pump 246b via the gas exhaust pipe 231a, and the process chamber 201 is controlled to have a pressure that is in, for example, a range of 0.1 Pa to 266 Pa. The turbo molecule pump 246a and the dry pump 246b are continuously operated at least until the substrate unloading process G is completed.

When the above state is maintained for a predetermined time, e.g., for forty to sixty seconds, the wafer 200 is gradually heated to a predetermined temperature by heat radiated from the susceptor 217, starting from a surface of the wafer 200 adjacent to the susceptor 217. In such case, since the wafer 200 is supported while being spaced from the susceptor 217, the surface of the wafer 200 adjacent to the susceptor 217 may be suppressed from being rapidly heated, and thus the difference between the speeds of heating a surface of the wafer 200 (hereinafter also referred to as the 'upper surface' of the wafer 200) opposite the surface of the wafer 200 adjacent to the susceptor 217 (hereinafter also referred to as the 'lower surface' of the wafer 200) may be decreased to suppress distortion of the wafer 200.

The distance between the wafer 200 and the susceptor 217 is preferably controlled based on the difference between the temperature of the wafer 200 when the wafer 200 is loaded (e.g., room temperature) and a predetermined temperature to which the susceptor 217 is heated. That is, when the difference between the temperature of the wafer 200 and the temperature of the susceptor 217 is large, the distance between the wafer 200 and the susceptor 217 may be increased to suppress the lower surface of the wafer 200 from being rapidly heated, thereby preventing a difference between the speeds of heating the top and lower surfaces of the wafer 200. When the difference between the temperature of the wafer 200 and the temperature of the susceptor 217 is small, the distance between the wafer 200 and the susceptor 217 may be decreased to rapidly heat the wafer 200, thereby shortening a time required to heat the wafer 200 to the predetermined temperature. The distance between the wafer 200 and the susceptor 217 may be controlled, for example, by moving the susceptor 217 up or down by the susceptor lifting mechanism 268.

[Substrate Transfer Process C]

After a predetermined time elapses, the wafer 200 heated to the predetermined temperature is transferred to the susceptor 217 from the wafer lifter pins 266. That is, the susceptor 217 is moved up by the susceptor lifting mechanism 268, and the wafer 200 is supported on the top surface of the susceptor 217. Thereafter, the wafer 200 is moved up to a predetermined process position.

[Process Gas Supply Process D]

Next, a nitrogen-containing gas ($N_2$ gas in the present embodiment) serving as a modifying process gas for nitridating the oxide film formed on the wafer 200 and hydrogen gas are supplied into the process chamber 201. As described above, the hydrogen gas is used to control the concentration of nitrogen in the process chamber 201 or improve the efficiency of nitridating the oxide film on the wafer 200. In detail, the valves 253a, 253b and 254 are opened and $H_2$ gas and $N_2$ gas are supplied into the process chamber 201 via the buffer chamber 237 while the flow rates of the $H_2$ gas and the $N_2$ gas are controlled by the MFCs 252a and 252b. In such case, the flow rates of the $H_2$ gas and the $N_2$ gas are controlled to a predetermined level that is, for example, in a range of 50 sccm to 2,000 sccm. Also, the inside of the process chamber 201 is exhausted by controlling the degree of opening the APC 242 such that the inside of the process chamber 201 has a pressure that is, for example, in a range of 1 Pa to 266 Pa. As described above, the $H_2$ gas and the $N_2$ gas are continuously supplied while the inside of the process chamber 201 is appropriately exhausted until the plasma processing process E is completed. In the process gas supply process D, the valve 253d may be opened and the modifying process gas may be diluted by supplying Ar gas while controlling the flow rate of the Ar gas by the MFC 252d if needed.

[Plasma Processing Process E]

After the pressure in the process chamber 201 is stabilized, supply of high-frequency power whose predetermined output value is, for example, in a range of 150 W to 1,000 W to the container type electrode 215 from the high-frequency power source 273 via the matching device 272 is started. In such case, the impedance varying mechanism 274 is controlled beforehand to have a predetermined impedance value to adjust the difference between electric potentials of the susceptor 217 and the container type electrode 215, i.e., a bias voltage of the susceptor 217, to a predetermined value. Thus, the $N_2$ gas and the $H_2$ gas are excited by causing a plasma discharge to occur in the inside of the process chamber 201, and more specifically, the first plasma generating region 224 above the wafer 200. The $N_2$ gas and the $H_2$ gas are changed to, for example, a plasma state and dissociated to generate reactive species such as nitrogen active species containing nitrogen (N). A surface of the wafer 200 is modified, i.e., nitridated, by the nitrogen active species generated when the $N_2$ gas is excited.

Thereafter, after a predetermined process time (5 to 120 seconds), e.g., 45 seconds, elapses, the supply of the high-frequency power from the high-frequency power source 273 is stopped and the plasma discharge generated in the process chamber 201 is stopped. Also, the valves 253a, 253b and 254 are closed to stop the supply of the $H_2$ gas and the $N_2$ gas into the process chamber 201. Accordingly, the plasma processing process E ends.

[Exhausting Process F]

After the supply of the $H_2$ gas and the $N_2$ gas is stopped, the inside of the process chamber 201 is exhausted using the gas exhaust pipe 231a. Thus, the $H_2$ gas and the $N_2$ gas or a gas remaining after the reaction of the $N_2$ gas is exhausted from the process chamber 201 to the outside. Then, the degree of opening the APC 242 is controlled to adjust the inside of the process chamber 201 to have a pressure (e.g., 100 Pa) substantially the same as pressure in the substrate transfer chamber (a place to which the wafer 200 is to be discharged, not shown) adjacent to the process chamber 201.

[Substrate Unloading Process G]

After the pressure in the process chamber 201 reaches a predetermined pressure, the susceptor 217 is moved down to the wafer transfer position to support the wafer 200 on the wafer lifter pins 266. Then, the gate valve 244 is opened and the wafer 200 is discharged to the outside of the process chamber 201 using the transfer mechanism. Accordingly, the product substrate processing process ends.

(2-2) Metal Removing Process

Figure 7:
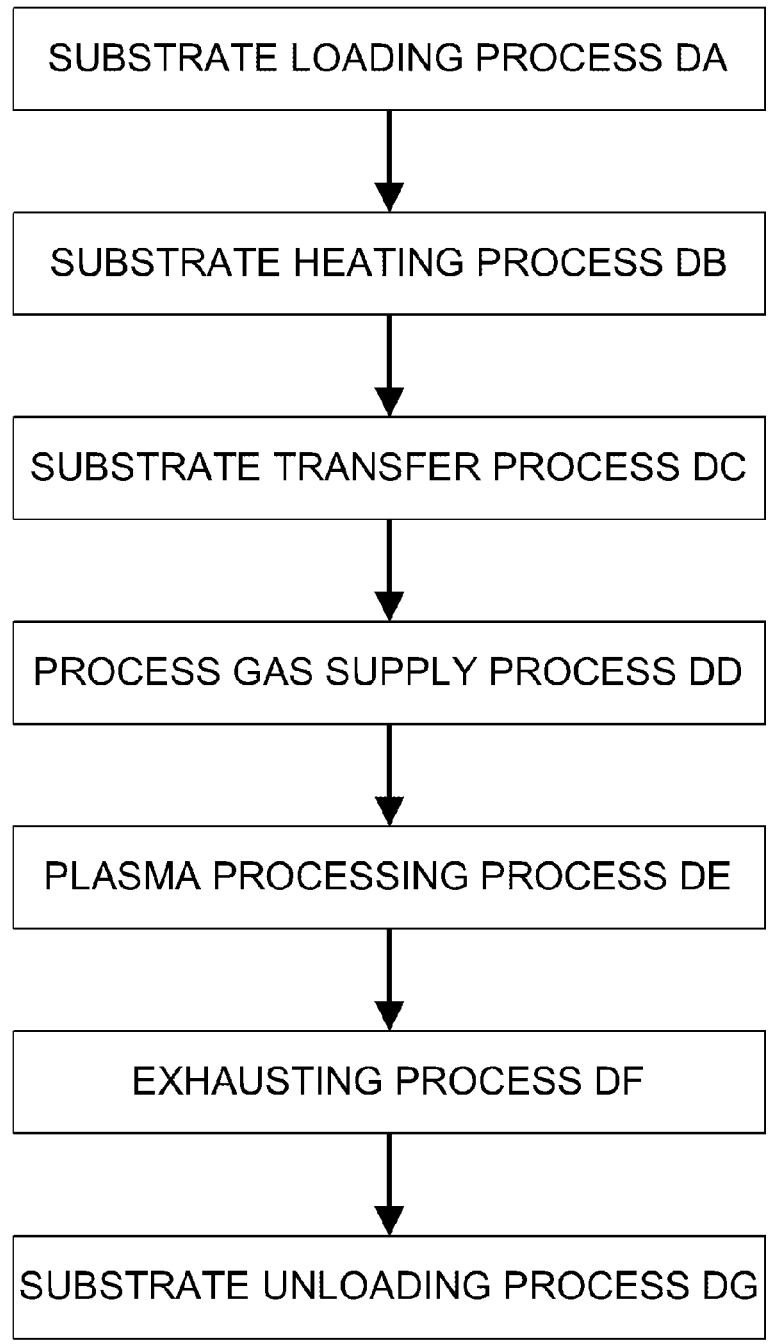
FIG. 7 is a flowchart of a metal contamination removing process according to the first embodiment of the present invention.
Figure 8:
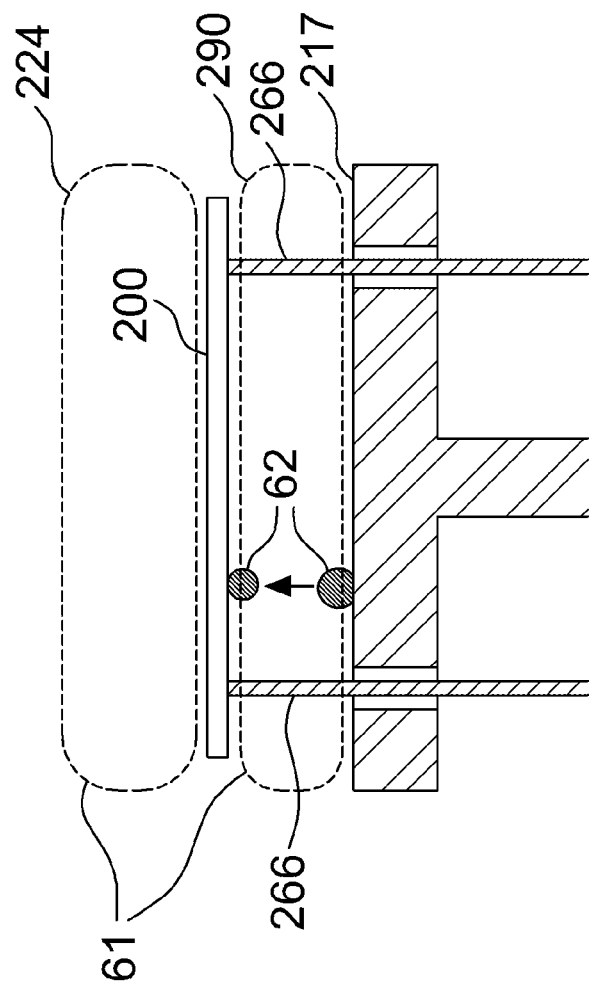
FIG. 8 is a conceptual diagram of a vertical cross-section of the MMT plasma processing apparatus when a metal is removed according to the first embodiment of the present invention.

Next, the metal removing process according to the present invention will be described with reference to FIG. 7. The metal removing process is performed before or after the product substrate processing process is performed, so that a product wafer may not be contaminated with metals in the process chamber 201, and particularly, sodium (Na) generated from quartz which is a material of the susceptor 217 or an inner wall of the process chamber 201 during the product substrate processing process which is a main processing process. For example, the metal removing process is performed after the product substrate processing process is performed a predetermined number of times. FIG. 8 is a conceptual diagram of a vertical cross-section of the MMT plasma processing apparatus when a metal is removed according to the first embodiment of the present invention. As illustrated in FIG. 8, in the metal removing process, excitation is performed using plasma in a state in which a dummy wafer instead of a product substrate is floated from the top surface of the susceptor 217. In FIG. 8, reference numeral '61' denotes plasma and reference numeral '62' denotes a metal such as sodium.

In the metal removing process, the state in which the dummy wafer is floated from the top surface of the susceptor 217, i.e., a space 290 between the dummy wafer and the susceptor 217 is formed. In such case, a plasma treatment is performed to generate plasma in the second plasma generating region 290 so as to discharge a metal 62 such as sodium from the susceptor 217 or an inner wall of the process chamber 201, and, mainly, the discharged metal 62 is attached to a back surface of the dummy wafer. The back surface of the dummy wafer means a lower surface of the dummy wafer facing the susceptor 217. Then, the dummy wafer to which the discharged metal 62 is attached is collected, and thus a metal may be removed from the inside of the process chamber 201 to suppress a product substrate from being contaminated with the metal in the product substrate processing process. A bare wafer having no film on a surface or back surface thereof is used as a dummy wafer for removing a metal. Preferably, a new wafer or a bare wafer that is cleaned by a managing device and hardly contaminated with a metal is used as such a dummy wafer. For example, when a silicon substrate is used, a contaminant may be prevented from being generated from the substrate. Also, a dummy substrate is preferably formed of a conductive material. When a dummy substrate is formed of a conductive material, the dummy substrate may be charged with electricity to promote adsorption of a contaminant.

Also, in the metal removing process, stronger plasma is preferably generated in the second plasma generating region 290 than in the first plasma generating region 224 so as to discharge a metal such as sodium present in the susceptor 217 or an inner wall of the process chamber 201. In the metal removing process, a treatment using strong plasma may be performed according to at least one among the following ways (a) to (d). The generating of the stronger plasma in the second plasma generating region 290 than in the first plasma generating region 224 means that the density of electric charges (the amount of ions or radicals) in the second plasma generating region 290 is higher than that in the first plasma generating region 224.

(a) The distance between the wafer 200 and the susceptor 217 is set to be in a range of 0.5 mm 30 mm. Thus, stronger plasma may be generated in the second plasma generating region 290 than in the first plasma generating region 224, and thus a metal may be easily discharged from a surface or the inside of the susceptor 217.

(b) A bias voltage of the susceptor 217 is set to be higher than that in the product substrate processing process. Thus, the amount of plasma flowing into the susceptor 217 may be increased and a metal may be easily discharged from the susceptor 217.

(c) The intensity of high-frequency power supplied to the container type electrode 215 is set to be higher than that in the substrate processing process. Thus, a large amount of plasma may be provided to a space between a back surface of a dummy wafer and the top surface of the susceptor 217.

(d) The duration of a plasma treatment is set to be longer than that of the substrate processing process. Thus, the susceptor 217 or the inner walls of the process chamber 201 may be exposed to plasma for a long time.

In the metal removing process, a substrate loading process DA, a substrate heating process DB, a process gas supply process DD, a plasma processing process DE, an exhausting process DF and a substrate unloading process DG are performed. The substrate loading process DA and the substrate heating process DB are the same as the substrate loading process A and the substrate heating process B included in the product substrate processing process, except that a dummy wafer is used instead of a product wafer. Thus, the substrate loading process DA and the substrate heating process DB are not redundantly described here again, and the process gas supply process DD, the plasma processing process DE, the exhausting process DF and the substrate unloading process DG will be described here.

[Process Gas Supply Process DD]

After the substrate loading process DA and the substrate heating process DB are performed similar to the substrate loading process A and the substrate heating process B, a process gas is supplied into the process chamber 201 in the process gas supply process DD. That is, in the process gas supply process DD, the process gas is supplied into the process chamber 201 in a state in which a dummy wafer is lifted and supported by the wafer lifter pins 266 above the susceptor 217 in a direction perpendicular to the top surface of the susceptor 217. In the metal removing process, the process gas may be hydrogen gas, nitrogen gas or oxygen gas that may excite plasma or may be a rare gas such as neon (Ne), helium (He) or argon (Ar) depending on a condition. Also, the process gas may be a combination of these gases. Also, the process gas may be different from a process gas for a product wafer but may be the same as the process gas for the product wafer depending on a condition. Preferably, the process gas includes at least one of hydrogen-containing gas and oxygen-containing gas.

In such case, the distance between the back surface of the dummy wafer and the top surface of the susceptor 217 is preferably in a range of 0.5 mm to 30 mm. By setting the distance between the back surface of the dummy wafer and the top surface of the susceptor 217 as described above, plasma may be generated in the second plasma generating region 290 which is the space between the back surface of the dummy wafer and the top surface of the susceptor 217 to easily increase the amount of impurities to be adsorbed to the back surface of the dummy wafer while discharging impurities. When the distance between the back surface of the dummy wafer and the top surface of the susceptor 217 is 0.5 mm or less, a gas does not flow to the back surface of the dummy wafer and thus plasma is difficult to generate. Thus, it is difficult to discharge impurities from the top surface of the susceptor 217. When the distance between the back surface of the dummy wafer and the top surface of the susceptor 217 is 30 mm or more, plasma generated in the second plasma generating region 290 is weaker than that in the first plasma generating region 224. Although plasma may be generated when the distance between the back surface of the dummy wafer and the top surface of the susceptor 217 is 30 mm or more, impurities may be discharged but the dummy wafer is difficult to be charged with electricity. Thus, the discharged impurities may not be attached to the dummy wafer and may scatter in the process chamber 201.

For example, $O_2$ gas and $H_2$ gas are supplied as process gases in predetermined flow rates, e.g., in 0.95 slm and 0.05 slm, respectively. Also, the inside of the process chamber 201 is exhausted by controlling the degree of opening the APC 242 such that pressure in the process chamber 201 may be in, for example, a range of 1 Pa to 1,330 Pa under which a plasma discharge may occur. Preferably, the pressure in the process chamber 201 is set to be in a range of 10 Pa to 400 Pa under which a plasma discharge may stably occur in the space between the back surface of the dummy wafer and the top surface of the susceptor 217. As described above, the $O_2$ gas and the $H_2$ gas are continuously supplied while the inside of process chamber 201 is appropriately exhausted, until the plasma processing process DE which will be described below ends.

[Plasma Processing Process DE]

In the plasma processing process DE, after the pressure in the process chamber 201 is stabilized, supply of high-frequency power having a predetermined output value to the container type electrode 215 from the high-frequency power source 273 via the matching device 272 begins. When the intensity of the high-frequency power is excessively low, plasma is not generated. When the intensity of the high-frequency power is excessively high, an abnormal discharge may occur in the process chamber 201 or quartz which is a material of the inner walls of the process chamber 201 may spatter. Thus, the intensity of the high-frequency power is controlled to be in a range of 50 W to 3,000 W. Preferably, the intensity of the high-frequency power is controlled to be in a range of 100 W to 2,000 W. In such case, the impedance varying mechanism 274 is controlled beforehand to have a predetermined impedance value. Thus, the $O_2$ gas and the $H_2$ gas present in the process chamber 201 are excited to generate plasma. When the generated plasma diffuses into the process chamber 201 or the space between the back surface of the dummy wafer and the top surface of the susceptor 217, a metal may be removed from an inner wall of the process chamber 201 or the susceptor 217. In the plasma processing process DE, a cycle of intermittently generating a plasma discharge is preferably repeated. For example, a plasma discharge is generated for 10 to 120 seconds, e.g., for 60 seconds, and is repeated 10 to 300 times every 10 to 120 seconds, e.g., repeated 200 times every 60 seconds. Thus, a contaminant may be removed while preventing components (such as the dummy wafer, the susceptor 217, etc.) placed in the process chamber 201 from being unnecessarily heated. Also, impurities floating in the process chamber 201 may be exhausted by performing vacuum-exhausting for about 30 seconds and supplying a gas for about 30 seconds between a plasma discharge and a subsequent plasma discharge.

Thereafter, after a predetermined process time, e.g., 400 minutes, elapses, the supply of the high-frequency power from the high-frequency power source 273 is stopped and the generation of the plasma discharge in the process chamber 201 is stopped. Also, the valves 253a, 253c and 254 are closed to stop the supply of the $O_2$ gas and the $H_2$ gas into the process chamber 201. Accordingly, the plasma processing process DE ends.

Figure 9:
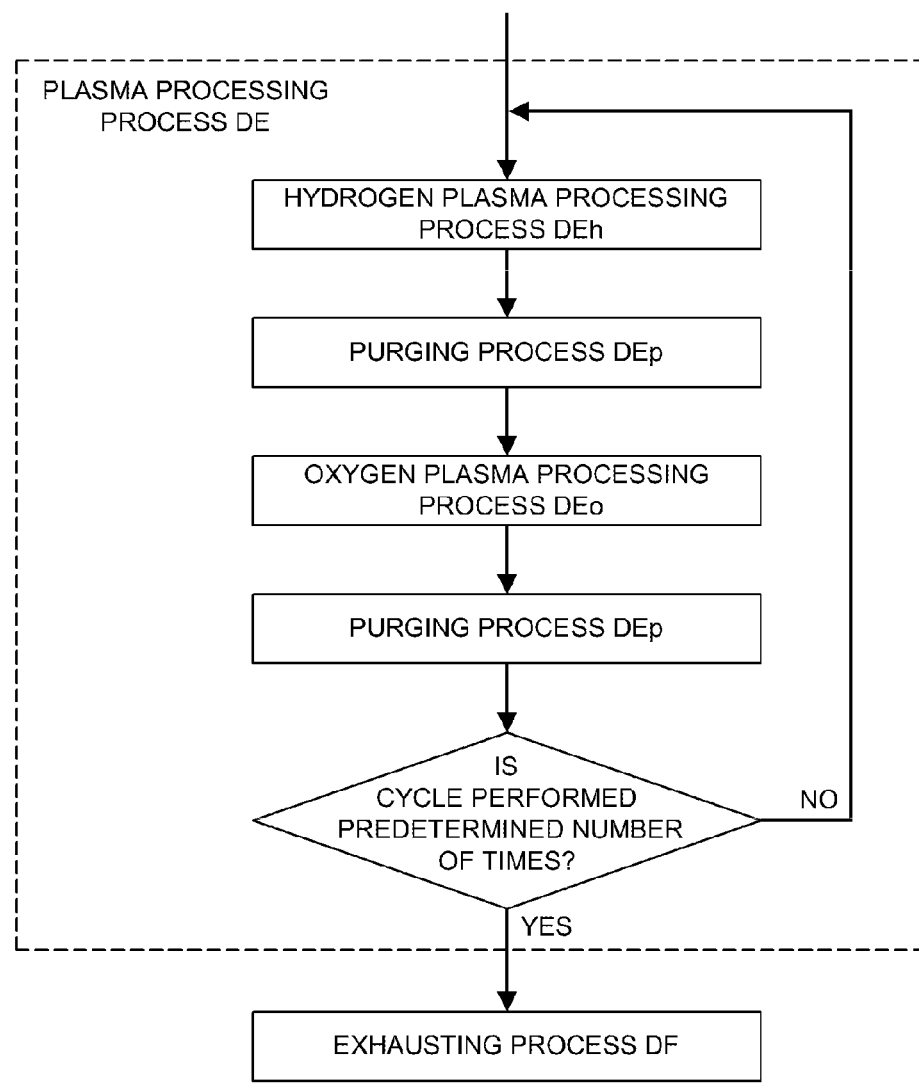
FIG. 9 is a flowchart of a plasma processing process according to another embodiment of the present invention.
Figure 10:
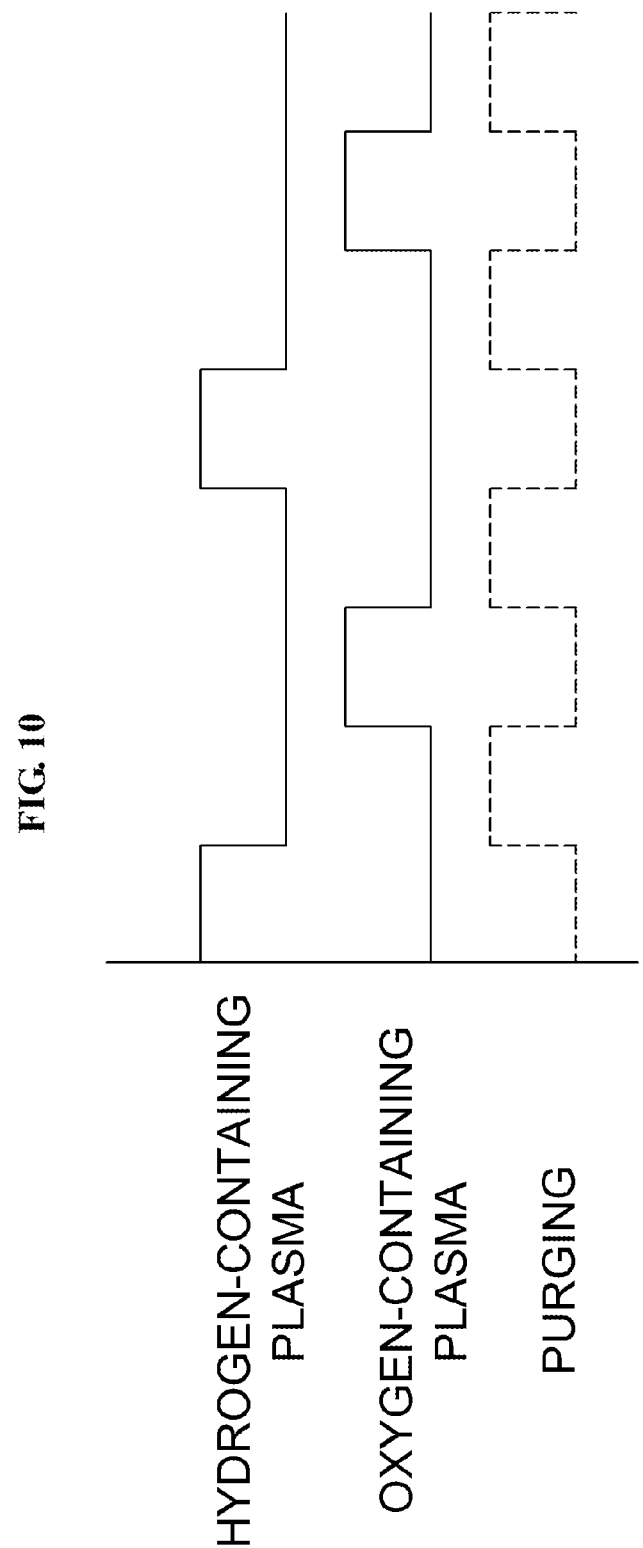
FIG. 10 is a diagram illustrating plasma generation timing in a plasma processing process according to another embodiment of the present invention.

Although a case in which a metal is removed in a redox atmosphere by supplying both an oxygen-containing gas and a hydrogen-containing gas has been described above, the present invention is not limited thereto. The efficiency of removing some metals may be increased by processing them only in an oxidation atmosphere to promote removing oxidized materials or by processing them only in a reducing atmosphere to promote removing reduced materials, based on degrees of contamination with the metals. Thus, as illustrated in FIGS. 9 and 10, an oxygen-containing gas and a hydrogen-containing gas may be alternately supplied so that plasma of the oxygen-containing gas and plasma of the hydrogen-containing gas may be alternately generated. Thus, an oxidized material or a reduced material may be removed by alternately performing oxidation and reduction. Also, removing of an oxidized material or a reduced material may be promoted by performing a purge process (at least one of exhausting and supply of an inert gas) between the plasma of the oxygen-containing gas and the plasma of the hydrogen-containing gas.

Figure 11:
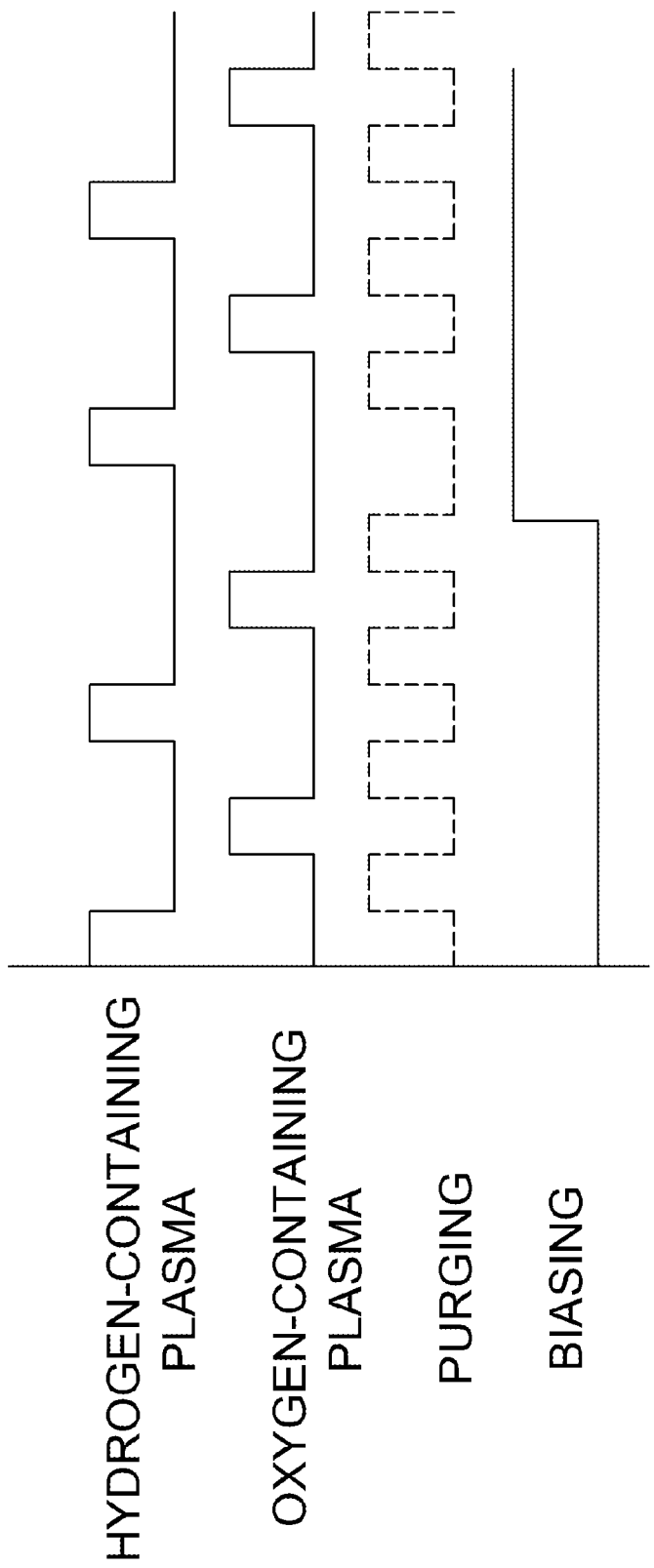
FIG. 11 is a diagram illustrating plasma generation timing in a plasma processing process according to another embodiment of the present invention.

Although the impedance control electrode 217b is used here, it may be not necessary. When the impedance control electrode 217b is used, an electric field formed in the process chamber 201 may be biased to a side of a substrate and a metallic contaminant may be easily attached to the substrate. When the impedance control electrode 217b is not used, plasma may be diffused into the whole process chamber 201, thereby increasing the efficiency of removing a contaminant in the process chamber 201. Also, in the metal removing process, the bias to the substrate may be switched off during the process by controlling the impedance varying mechanism 274, and the bias may be switched on and off. For example, as illustrated in FIG. 11, plasma generation may be started in a state in which the biasing of the electric field is 'off', a contaminant may be discharged from the process chamber 201, and the discharged contaminant may be adsorbed to a substrate by controlling the biasing of the electric field to be 'on' during the plasma generation.

[Exhausting Process DF]

After the supply of the $O_2$ gas and the $H_2$ gas is stopped, the inside of the process chamber 201 is exhausted using the gas exhaust pipe 231a. Thus, a gas containing the $O_2$ gas and the $H_2$ gas in the process chamber 201 is exhausted to the outside of the process chamber 201. Then, the degree of opening the APC 242 is adjusted to set pressure in the process chamber 201 to be substantially the same as pressure (e.g., 100 Pa) in the substrate transfer chamber (a place to which the wafer 200 is to be discharged) adjacent to the process chamber 201.

[Substrate Unloading Process DG]

After the pressure in the process chamber 201 reaches a predetermined pressure, the gate valve 244 is opened to discharge the wafer 200 to the outside of the process chamber 201 using the transfer mechanism. The metal removing process ends here.

Preferably, the metal removing process is repeatedly performed using a plurality of dummy wafers. That is, the substrate loading process DA, the substrate heating process DB, the process gas supply process DD, the plasma processing process DE, the exhausting process DF and the substrate unloading process DG may be performed using a first dummy wafer; the first dummy wafer may be unloaded from the process chamber 201; and the substrate loading process DA, the substrate heating process DB, the process gas supply process DD, the plasma processing process DE, the exhausting process DF and the substrate unloading process DG may be performed using a second dummy wafer. For example, two dummy wafers may be prepared and processed one by one. In such case, a metal such as sodium may be efficiently removed from the top surface or another region of the susceptor 217 or the inside of the process chamber 201.

Figure 12:
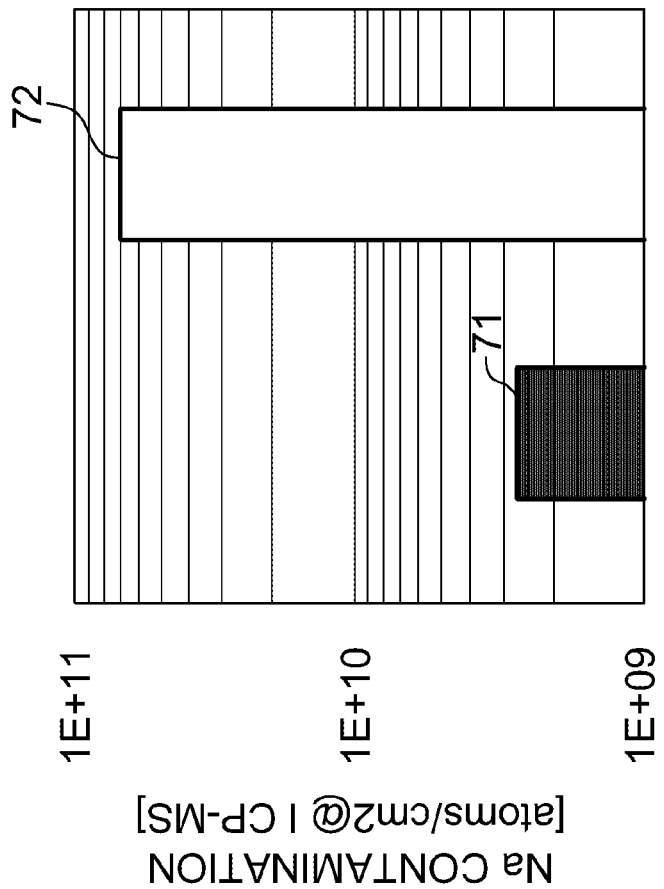
FIG. 12 is a graph showing metal-contaminations of a back surface of a wafer on which a nitride film is formed.

FIG. 12 is a graph showing metal-contaminations of a back surface of a wafer on which a nitride film is formed. In FIG. 12, reference numeral '71' represents a result of measuring contamination of a back surface of a product wafer with Na when a nitride film was formed on the product wafer after a metal removing process according to the present embodiment was performed, and reference numeral '72' represents a result of measuring contamination of the back surface of the product wafer with Na when a nitride film was formed on the product wafer after the metal removing process (a plasma treatment) was performed without using a dummy wafer. Both of these results are analysis results obtained using an inductively coupled plasma-mass spectrometry (ICP-MS) device. In FIG. 12, the vertical axis of the graph denotes the number of Na atoms per 1 $cm^2$.

In relation to the results denoted by reference numerals 71 and 72, the following metal removing conditions were set:

Process gas: oxygen gas (0.95 slm), hydrogen gas (0.05 slm),

Pressure in process chamber: 266 Pa,

RF power: 1,000 W,

Discharge time: 1 minute each time,

Discharge interval: 1 minute (vacuum-exhausting: 30 seconds, gas supply duration: 30 seconds), Discharge cycle: 200 times per dummy wafer, Number of dummy wafers used: two That is, a discharge (one minute each time) was repeatedly generated 200 times every one minute for one of dummy wafers, the dummy wafer was replaced with another dummy wafer, and the discharge was repeated 200 times every minute for the other dummy wafer. That is, the discharge (one minute each time) was performed a total of 400 times. As described above, when the discharge is intermittently generated, a contaminant may be removed while preventing components (such as a dummy wafer, the susceptor 217, etc.) placed in the process chamber 201 from being unnecessarily heated. Also, vacuum-exhausting and supply of a gas may be performed at least once between a plasma discharge and a subsequent plasma discharge. Impurities floating in the process chamber 201 may be efficiently exhausted by performing the vacuum-exhausting and the supply of the gas. For example, the vacuum-exhausting may be performed for about 30 seconds and a gas may be supplied for about 30 seconds. Furthermore, the efficiency of removing impurities may be greatly increased by alternately performing the vacuum-exhausting and the supply of the gas.

As illustrated in FIG. 12, contamination of a back surface of a product wafer with Na was high, i.e., 7E10, when a metal removing process was performed without using a dummy wafer. In contrast, contamination of a back surface of a product wafer with Na was low, i.e., 3E9 or less, when a metal removing process using a dummy wafer according to the present embodiment was performed. In such case, the degree of contamination with Na satisfies demands in most semiconductor processes under present circumstances.

Figure 13:
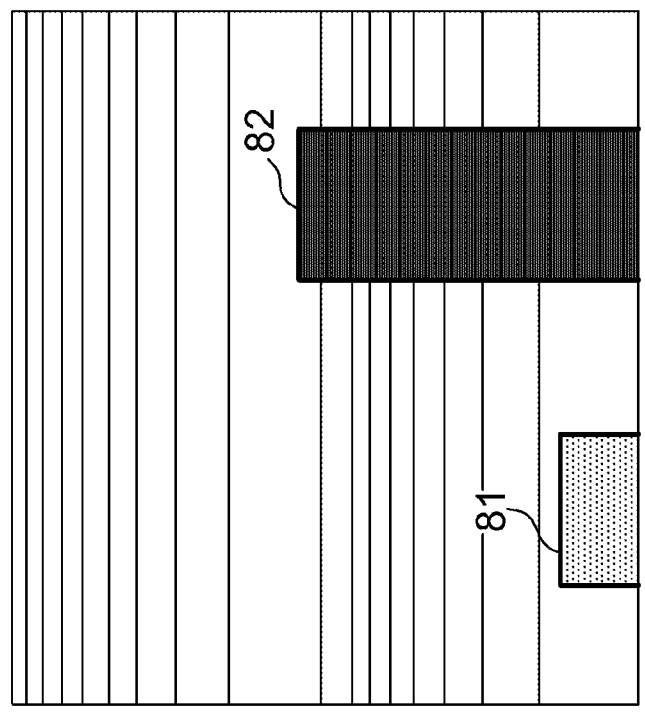
FIG. 13 is a graph showing metal-contaminations of a back surface of a wafer on which an oxide film is formed.

FIG. 13 is a graph showing metal-contaminations of a back surface of a wafer on which an oxide film is formed. In FIG. 13, reference numeral '81' represents a result of measuring contamination of a back surface of a product wafer with Na when an oxide film was formed on the product wafer after a metal removing process according to the present embodiment was performed, and reference numeral '82' represents a result of measuring contamination of the back surface of the product wafer with Na when an oxide film was formed on the product wafer after the metal removing process (a plasma treatment) was performed without using a dummy wafer. As illustrated in FIG. 13, the contamination of the back surface of the product wafer when the metal removing process was performed without using a dummy wafer exceeded 1E10 but was 1E9 when the metal removing process was performed using a dummy wafer.

Figure 14:
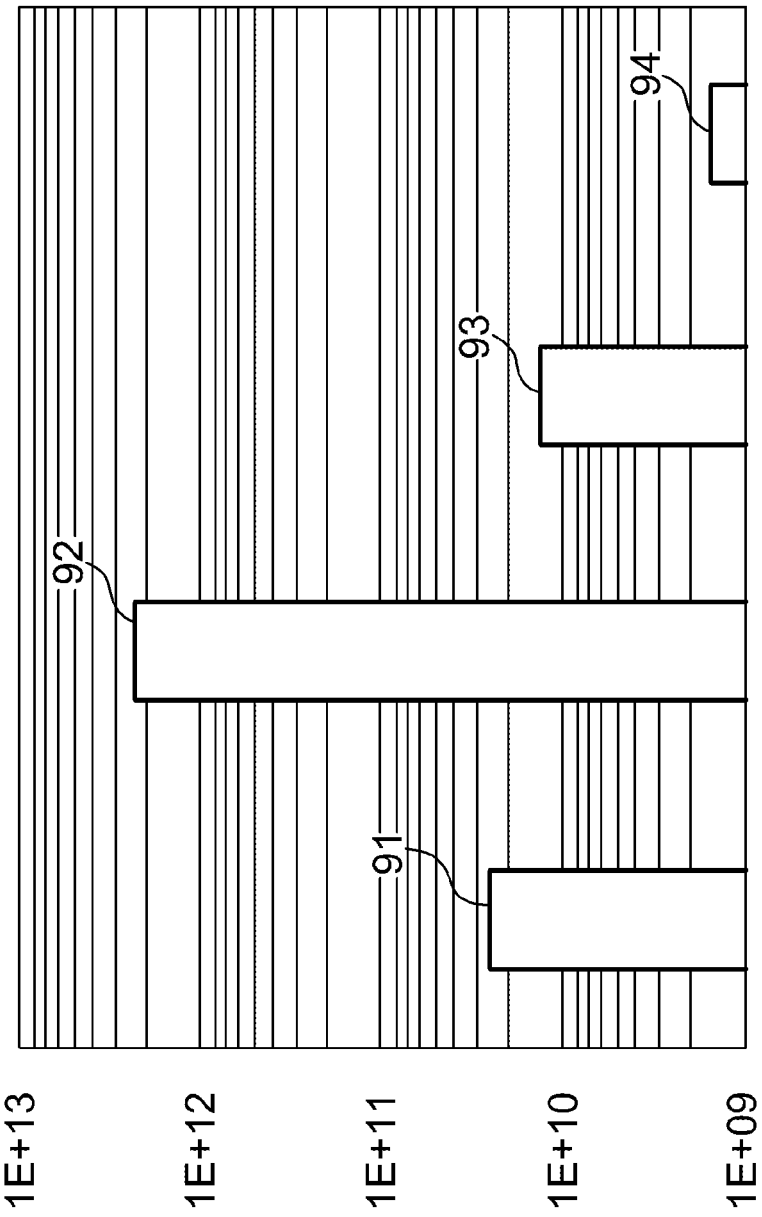
FIG. 14 is a graph showing contaminations of a wafer under various conditions.

FIG. 14 is a graph showing contaminations of a wafer under various conditions. In FIG. 14, reference numeral '91' represents a result of measuring contamination of a back surface of a sample wafer with Na when the sample wafer was placed on the susceptor 217 and a film was formed on the sample wafer. Reference numeral 92 represents a result of measuring contamination of a back surface of a sample wafer with Na when the sample wafer was placed on the wafer lifter pins 266 and a film was formed on the sample wafer. Reference numeral 93 represents a result of measuring contamination of a back surface of a sample wafer with Na when the sample wafer was placed on the susceptor 217 and was directly unloaded from the process chamber 201 without forming a film on the sample wafer. Reference numeral 94 represents a result of measuring contamination of a back surface of a sample wafer with Na when the sample wafer was placed on the wafer lifter pins 266 and was directly unloaded from the process chamber 201 without forming a film on the sample wafer. All the results 91 through 94 are analysis results obtained using an ICP-MS device. In the graph of FIG. 14, the vertical axis denotes the number of Na atoms per 1 $cm^2$. Also, the metal removing process according to the present embodiment was not performed beforehand in the process chamber 201.

As illustrated in FIG. 14, the contamination with Na was 2E10 when the sample wafer was placed on the susceptor 217 and a film was formed on the sample wafer (the result 91) but was 1E12 or higher when the sample wafer was placed on the wafer lifter pins 266 and a film was formed on the sample wafer (the result 92). Also, the contamination with Na when the sample wafer was simply in contact with the top of the susceptor 217 (the result 93) was substantially the same as that in the reference numeral 91. The contamination with Na when the sample wafer was simply placed on the wafer lifter pins 266 (the result 94) was far lower than that in the reference numeral 92.

It was noted from the results 93 and 94 that the back surface of the sample wafer was contaminated with Na when the sample wafer was in contact with the susceptor 217 and thus the amount of Na on the susceptor 217 should be decreased to decrease the contamination of the back surface of the sample wafer with Na. Also, it was noted from the results 91 and 92 that the sample wafer was contaminated with a larger amount of Na, i.e., a larger amount of Na on the susceptor 217 was adsorbed to the back surface of the sample wafer, when the sample wafer was placed on the wafer lifter pins 266 and a film was formed on the sample wafer than when the sample wafer was placed on the susceptor 217 and a film was formed on the sample wafer. In the present embodiment, based on this phenomenon, Na is removed from the susceptor 217 by repeatedly transferring Na from the susceptor 217 to the back surface of the wafer 200 so that Na may be discharged to the outside of the process chamber 201.

According to the first embodiment, at least the following effects (1) to (6) may be achieved.

(1) Since in the metal removing process, excitation is performed using plasma in a state in which a dummy wafer is floated from a top surface of a susceptor, a metal such as Na may be easily removed from the top surface of the susceptor. Thus, a product substrate may be suppressed from being contaminated with a metal in the product substrate processing process.

(2) Since stronger plasma is generated in the metal removing process than in the product substrate processing process, a metal that contaminated the top surface of the susceptor may be efficiently removed by generating a strong discharge in a space between a back surface of a dummy wafer and the top surface of the susceptor.

(3) Since a cycle of intermittently repeatedly generating a plasma discharge is performed in the metal removing process, components (such as a dummy wafer or a susceptor) placed in a process chamber may be prevented from being excessively heated.

(4) In the metal removing process, when a plasma discharge is intermittently repeatedly performed, vacuum-exhausting and supply of a gas are performed while the plasma discharge is not generated, thereby efficiently exhausting impurities floating in the process chamber.

(5) In the metal removing process, a metal such as Na may be more effectively removed from the top surface of the susceptor or the susceptor by first processing a first dummy wafer, discharging the first dummy wafer from the inside of the process chamber, and processing a second dummy wafer, i.e., by continuously processing a plurality of dummy wafer.

(6) In an excitation step included in the metal removing process, a magnetron discharge is generated in the vicinity of a dummy wafer and thus impurities may be efficiently discharged from the top surface of the susceptor.

Although the substrate processing apparatus 100 embodied as an MMT apparatus is used in the previous embodiment, the present invention is not limited thereto and is also applicable to other devices, e.g., an ICP device or an electron cyclotron resonance (ECR) device.

Second Embodiment

Figure 3:
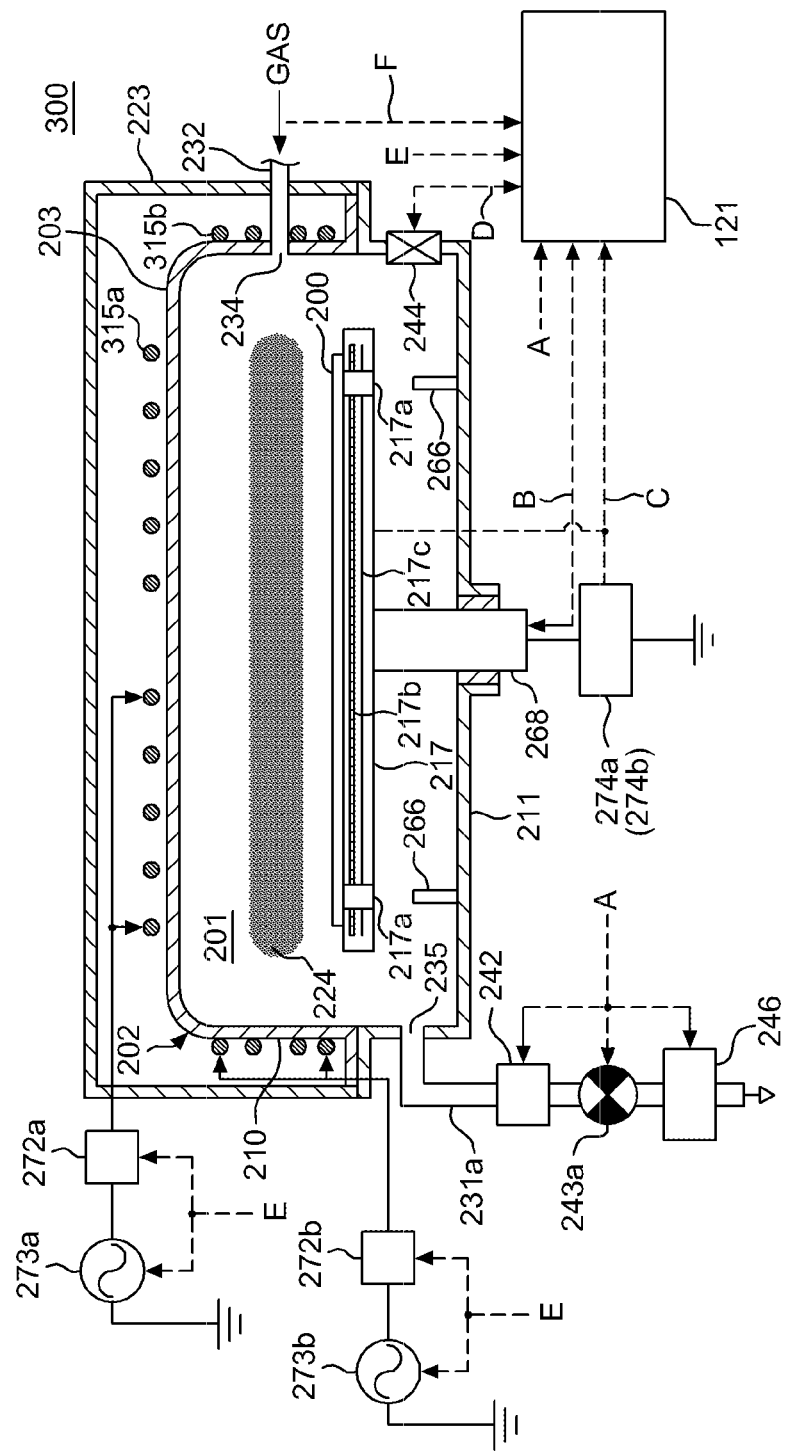
FIG. 3 is a vertical cross-sectional view of an inductively coupled plasma (ICP) type plasma processing apparatus according to a second embodiment of the present invention.

Next, a second embodiment of the present invention will be described with reference to FIG. 3. FIG. 3 is a vertical cross-sectional view of an ICP type plasma processing apparatus 300 which is a substrate processing apparatus according to the second embodiment of the present invention. In the second embodiment, components that are the same as those in the first embodiment are denoted by the same reference numerals and are not redundantly described here. In the ICP type plasma processing apparatus 300 according to the second embodiment, plasma is generated by supplying power via matching devices 272a and 272b, high-frequency power sources 273a and 273b and inductive coils 315a and 315b. The inductive coil 315a is installed at an external ceiling side of a process container 203. The inductive coil 315b is installed at an outer side of an outer circumferential wall of the process container 203.

Similarly, in the second embodiment, a process gas containing hydrogen atoms or nitrogen atoms is supplied into a process chamber 201 from a gas supply pipe 232 via a gas inlet 234 during removing of a metal or processing of a product substrate. Also, when high-frequency power is supplied to the inductive coils 315a and 315b which are excitation units, an electric field is generated due to electromagnetic induction before and after a gas is supplied. Active species may be generated by exciting the supplied process gas to a plasma state by using the electric field as energy. Thereafter, a metal removing process according to the second embodiment of the present invention is performed in a state in which a dummy wafer is floated from a top surface of a susceptor.

Third Embodiment

Figure 4:
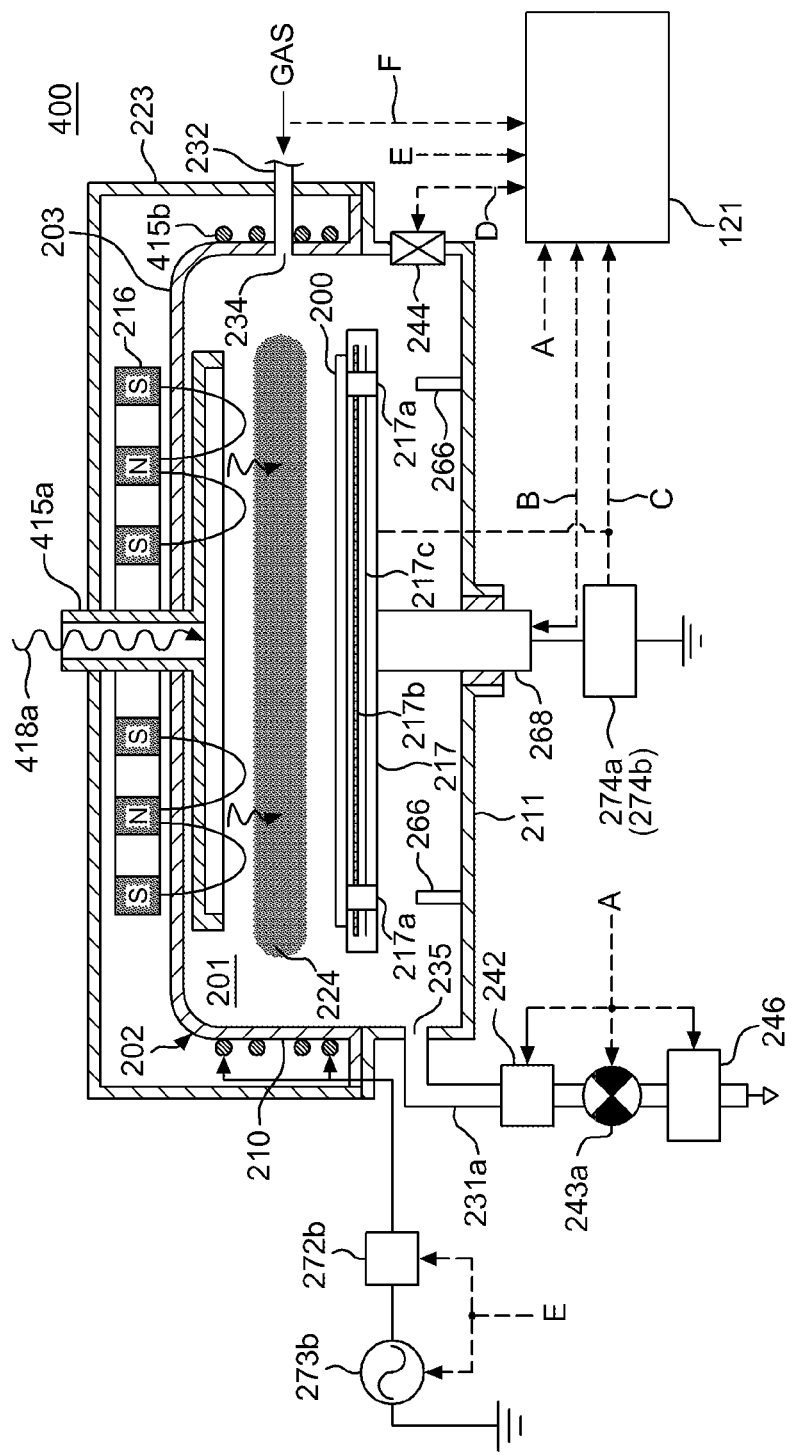
FIG. 4 is a vertical cross-sectional view of an electron cyclotron resonance (ECR) type plasma processing apparatus according to a third embodiment of the present invention.

Next, a third embodiment of the present invention will be described with reference to FIG. 4. FIG. 4 is a vertical cross-sectional view of an ECR type plasma processing apparatus 400 which is a substrate processing apparatus according to the third embodiment of the present invention. In the third embodiment, components that are the same as those in the first embodiment are denoted by the same reference numerals and are not redundantly described here. Also, a gas supply unit is not illustrated here. The ECR type plasma processing apparatus 400 according to the third embodiment includes a matching device 272b that supplies microwaves to generate plasma, high-frequency power source 273b, a microwave supply pipe 415a and an inductive coil 415b. The microwave supply pipe 415a is installed on a ceiling wall of a process container 203. The inductive coil 415b is installed at an outer side of an outer circumferential wall of the process container 203.

Similarly, in the third embodiment, a process gas containing hydrogen atoms or nitrogen atoms is supplied into a process chamber 201 from a gas supply pipe 232 via a gas inlet 234 during removing of a metal or processing of a product substrate. Also, microwaves 418a are supplied to the microwave supply pipe 415a and emitted into the process chamber 201 before and after a gas is supplied. Active species may be generated by exciting, to a plasma state, the microwaves 418a and the process gas supplied from the inductive coil 415b using high-frequency power. For example, variable frequency microwaves (VFM), fixed frequency microwaves (FFM), etc. may be used as the microwaves 418a. Thereafter, a metal removing process according to the third embodiment of the present invention is performed in a state in which a dummy wafer is floated from a top surface of a susceptor.

In addition, a product wafer may be processed or a metal may be removed by exciting a gas supplied into the process chamber 201 by radiating ultraviolet rays or laser beams instead of plasma. Also, the gas supplied into the process chamber 201 may be excited by thermal energy generated from a heating device such as a rapid thermal processing (RTP) device.

The present invention is not, however, limited to the embodiments set forth herein and may be embodied in many different forms. Although in the first embodiment, a substrate support configured to support a dummy substrate is disposed right above a substrate placement unit configured to place thereon a substrate to be processed, the present invention is not limited thereto and the position of the substrate support is not limited provided that plasma can be generated in a space between a back surface of a dummy substrate and a top surface of the substrate placement unit. For example, the substrate support may be disposed above diagonally from the substrate placement unit. Also, although in the first embodiment, a main processing process and a metal removing process are continuously performed, the present invention is not limited thereto and the substrate placement unit may be cleaned by performing only the metal removing process. Also, although cases in which a wafer is processed have been described in the above embodiments, an object to be processed may be a photomask, a printed circuit board, a liquid crystal panel, a compact disk, a magnetic disk, etc.

Although plasma that is a mixture of hydrogen and oxygen is generated by supplying and exciting hydrogen gas and oxygen gas in the above embodiments, the present invention is not limited thereto. For example, a process of supplying only oxygen-containing gas and a process of supplying only hydrogen-containing gas may be separately performed depending on the type of impurities. For example, plasma of hydrogen-containing gas and plasma of oxygen-containing gas may be alternately generated. Also, a purge process of performing at least one of supplying an inert gas and exhausting the inert gas may be performed between plasma of hydrogen-containing gas and plasma of oxygen-containing gas when the plasma of hydrogen-containing gas and the plasma of oxygen-containing gas are alternately generated. By alternately performing a process of generating plasma of hydrogen-containing gas and a process of generating plasma of oxygen-containing gas, impurities may be removed by reducing the impurities and attaching the reduced impurities to a dummy substrate in the process of generating plasma of hydrogen-containing gas and by oxidizing the impurities and attaching the oxidized impurities to the dummy substrate in the process of generating plasma of oxygen-containing gas. That is, the efficiency of removing impurities from the inside of the process chamber may be improved.

As described above, a substrate to be processed may be suppressed from being contaminated from a contaminant generated in a process chamber.

Exemplary Embodiments of the Invention

Hereinafter, exemplary embodiments of the present invention are supplementarily noted.

[Supplementary Note 1]

According to an aspect of the present invention, there is provided a semiconductor device manufacturing method including a main substrate processing process and a metal removing process, wherein the main substrate processing process includes a substrate loading step of loading a substrate to be processed into a process chamber, a placing step of placing the substrate on a substrate placement unit installed in the process chamber, a first gas supply step of supplying a first process gas into the process chamber, a first excitation step of exciting the first process gas supplied into the process chamber in a state in which the substrate is placed on the substrate placement unit, a first exhausting step of exhausting the first process gas from the inside of the process chamber, and a substrate unloading step of unloading the substrate on which the first excitation step is performed from the process chamber; and the metal removing process includes a dummy substrate loading step of loading a dummy substrate into the process chamber, a supporting step of supporting the dummy substrate at a position spaced vertically from a top surface of the substrate placement unit, a second gas supply step of supplying a second process gas into the process chamber, a second excitation step of exciting the second process gas supplied into the process chamber in a state in which the dummy substrate is supported at the position spaced from the top surface of the substrate placement unit, a second exhausting step of exhausting the second process gas from the inside of the process chamber, and a dummy substrate unloading step of unloading the dummy substrate on which the second excitation step is performed from the process chamber, wherein the second process gas is the same as or different from the first process gas.

[Supplementary Note 2]

In the method of Supplementary note 1, preferably, the metal removing process is performed at least one of before the main substrate processing process is performed and after the main substrate processing process is performed.

[Supplementary Note 3]

In the method of Supplementary note 1 or 2, preferably, in the second excitation step of the metal removing process, the intensity of power for exciting the second process gas is higher than that of power for exciting the first process gas in the main substrate processing process, wherein in addition to generation of plasma by supplying high-frequency power, heating, laser radiation, lamp heating or radiation of ultraviolet rays is used to excite the first and second process gases.

[Supplementary Note 4]

In the method of any one of Supplementary notes 1 through 3, preferably, a magnetron discharge is formed in the vicinity of the dummy substrate in the second excitation step of the metal removing process.

[Supplementary Note 5]

In the method of any one of Supplementary notes 1 through 4, preferably, a distance between a back surface of the dummy substrate supported by a substrate support and the top surface of the substrate placement unit is set such that the amount of plasma in the second plasma generating region is larger than that of plasma in the first plasma generating region.

[Supplementary Note 6]

In the method of any one of Supplementary notes 1 through 5, preferably, the distance between the back surface of the dummy substrate supported by the substrate support and the top surface of the substrate placement unit is in a range of 0.5 mm to 30 mm.

[Supplementary Note 7]

In the method of any one of Supplementary notes 1 through 6, preferably, the dummy substrate has a conductive property.

[Supplementary Note 8]

In the method of Supplementary note 7, preferably, the dummy substrate is a silicon substrate.

[Supplementary Note 9]

In the method of any one of Supplementary notes 1 through 8, preferably, the second process gas includes at least one selected from the group consisting of hydrogen gas, oxygen gas and nitrogen gas.

[Supplementary Note 10]

In the method of any one of Supplementary notes 1 through 9, preferably, a metal to be removed in the metal removing process includes at least sodium, and also includes at least one selected from a light metal group consisting of lithium, potassium and calcium and a heavy metal group consisting of aluminum, chromium, manganese, iron, cobalt, nickel, copper, zinc, titanium, strontium, zirconium, lanthanum, hafnium, tungsten and platinum.

[Supplementary Note 11]

In the method of any one of Supplementary notes 1 through 10, the power for exciting the second process gas in the second excitation step is preferably 50 W to 3,000 W and more preferably, 100 W to 2,000 W, and pressure in the process chamber is preferably 1 Pa to 1,330 Pa, and more preferably 10 Pa to 400 Pa.

[Supplementary Note 12]

In the method of any one of Supplementary notes 1 through 11, preferably, the second gas supply step, the second excitation step and the second exhausting step are repeatedly performed a plurality of times in the metal removing process.

[Supplementary Note 13]

In the method of Supplementary note 12, preferably, a same dummy wafer or different dummy wafers are used in the second gas supply step, the second excitation step and the second exhausting step of the metal removing process which are repeatedly performed a plurality of times.

[Supplementary Note 14]

According to another aspect of the present invention, there is provided a substrate processing program including:

(a) a sequence of loading a substrate to be processed into a process chamber;

(b) a sequence of placing the substrate on a substrate placement unit installed in the process chamber;

(c) a sequence of supplying a first process gas into the process chamber;

(d) a sequence of exciting the first process gas supplied into the process chamber in a state in which the substrate is placed on the substrate placement unit;

(e) a sequence of exhausting the first process gas from the inside of the process chamber;

(f) a sequence of unloading the substrate on which the sequence (d) is performed from the process chamber;

(g) a sequence of loading a dummy substrate into the process chamber;

(h) a sequence of supporting the dummy substrate at a position spaced vertically from a top surface of the substrate placement unit;

(i) a sequence of supplying a second process gas into the process chamber;

(j) a step of exciting the second process gas supplied into the process chamber in a state in which the dummy substrate is supported at the position spaced vertically from the top surface of the substrate placement unit;

(k) a sequence of exhausting the second process gas from the inside of the process chamber; and (l) a sequence of unloading the dummy substrate on which the sequence (j) is performed from the process chamber.

[Supplementary Note 15]

According to another aspect of the present invention, there is provided a non-transitory computer-readable recording medium having recorded thereon a substrate processing program including:

(a) a sequence of loading a substrate to be processed into a process chamber;

(b) a sequence of placing the substrate on a substrate placement unit installed in the process chamber;

(c) a sequence of supplying a first process gas into the process chamber;

(d) a sequence of exciting the first process gas supplied into the process chamber in a state in which the substrate is placed on the substrate placement unit;

(e) a sequence of exhausting the first process gas from the inside of the process chamber;

(f) a sequence of unloading the substrate on which the sequence (d) is performed from the process chamber;

(g) a sequence of loading a dummy substrate into the process chamber;

(h) a sequence of supporting the dummy substrate at a position spaced vertically from a top surface of the substrate placement unit;

(i) a sequence of supplying a second process gas into the process chamber;

(j) a step of exciting the second process gas supplied into the process chamber in a state in which the dummy substrate is supported at the position spaced vertically from the top surface of the substrate placement unit;

(k) a sequence of exhausting the second process gas from the inside of the process chamber; and (l) a sequence of unloading the dummy substrate on which the sequence (j) is performed from the process chamber.

[Supplementary Note 16]

According to another aspect of the present invention, there is provided a semiconductor device manufacturing apparatus including:

a process chamber configured to process a substrate to be processed and a dummy substrate;

a substrate placement unit installed in the process chamber and configured to place thereon the substrate;

a substrate support installed in the process chamber, configured to support the dummy substrate, and installed spaced vertically from a top surface of the substrate placement unit;

a gas supply unit configured to supply a first process gas and a second process gas into the process chamber;

a gas exhaust unit configured to exhaust the first process gas and the second process gas from the inside of the process chamber;

an excitation unit configured to excite the first process gas and the second process gas supplied into the process chamber; and a control unit configured to control at least one of the substrate placement unit and the substrate support and the gas supply unit, the gas exhaust unit and the excitation unit to excite the first process gas supplied into the process chamber in a state in which the substrate is placed on the substrate placement unit and to excite the second process gas supplied into the process chamber in a state in which the dummy substrate is supported by the substrate support.

[Supplementary Note 17]

According to another aspect of the present invention, there is provided a substrate processing apparatus including:

a process chamber configured to process a substrate to be processed and a dummy substrate;

a substrate placement unit installed in the process chamber and configured to place thereon the substrate;

a substrate support installed in the process chamber, configured to support the dummy substrate, and installed spaced vertically from a top surface of the substrate placement unit;

a gas supply unit configured to supply a first process gas and a second process gas into the process chamber;

a gas exhaust unit configured to exhaust the first process gas and the second process gas from the inside of the process chamber;

an excitation unit configured to excite the first process gas and the second process gas supplied into the process chamber; and a control unit configured to control at least one of the substrate placement unit and the substrate support and the gas supply unit, the gas exhaust unit and the excitation unit to excite the first process gas supplied into the process chamber in a state in which the substrate is placed on the substrate placement unit and excite the second process gas supplied into the process chamber in a state in which the dummy substrate is supported by the substrate support.

[Supplementary Note 18]

According to another aspect of the present invention, there is provided a semiconductor manufacturing method including a main processing process of processing a substrate to be processed in a process chamber and a metal removing process, wherein the metal removing process includes a dummy substrate loading step of loading a dummy substrate into the process chamber, a supporting step of supporting the dummy substrate at a position spaced vertically from a top surface of a substrate placement unit, a gas supply step of supplying a process gas into the process chamber, an excitation step of exciting the process gas supplied into the process chamber in a state in which the dummy substrate is supported at the position spaced from the top surface of the substrate placement unit, an exhausting step of exhausting the process gas from the inside of the process chamber and a dummy substrate unloading step of unloading the dummy substrate on which the excitation step is performed from the process chamber.

[Supplementary Note 19]

According to another aspect of the present invention, there is provided a method of removing or cleaning a metal, the method including:

(a) a step of loading a dummy substrate into a process chamber;

(b) a step of supporting the dummy substrate at a position spaced vertically spaced from a top surface of a substrate placement unit;

(c) a step of supplying a process gas into the process chamber;

(d) a step of exciting the process gas supplied into the process chamber in a state in which the dummy substrate is supported at the position spaced vertically from the top surface of the substrate placement unit;

(e) a step of exhausting the process gas from the inside of the process chamber; and (f) a step of unloading the dummy substrate on which the step (d) is performed from the process chamber.

[Supplementary Note 20]

According to another aspect of the present invention, there is provided a semiconductor device manufacturing method including a main substrate processing process and a metal removing process, wherein the main substrate processing process includes a substrate loading step of loading a substrate to be processed into a process chamber, a placing step of placing the substrate on a substrate placement unit installed in the process chamber, a first gas supply step of supplying a first process gas into the process chamber, a first excitation step of exciting the first process gas supplied into the process chamber in a state in which the substrate is placed on the substrate placement unit, a first exhausting step of exhausting the first process gas from the inside of the process chamber, and a substrate unloading step of unloading the substrate on which the first excitation step is performed from the process chamber; and the metal removing process includes a dummy substrate loading step of loading a dummy substrate into the process chamber, a supporting step of supporting the dummy substrate at a position spaced vertically from a top surface of the substrate placement unit, a second gas supply step of supplying a second process gas into the process chamber, a second excitation step of exciting the second process gas supplied into the process chamber in a state in which the dummy substrate is supported at the position spaced from the top surface of the substrate placement unit, a second exhausting step of exhausting the second process gas from the inside of the process chamber, and a dummy substrate unloading step of unloading the dummy substrate on which the second excitation step is performed from the process chamber.

[Supplementary Note 21]

According to another aspect of the present invention, there is provided a method of manufacturing a semiconductor device, the method including:

(a) generating and processing plasma in a first plasma generating region of a process chamber configured to process a substrate, and (b) forming a second plasma generating region in the process chamber, and generating the plasma in the first plasma generating region and the second plasma generating region.

[Supplementary Note 22]

In the method of Supplementary note 21, preferably, (b) includes (b-1) supplying a process gas containing at least one of a hydrogen-containing gas and an oxygen-containing gas into the process chamber; (b-2) exciting the process gas supplied into the process chamber; and (b-3) exhausting the inside of the process chamber.

[Supplementary Note 23]

In the method of Supplementary note 22, preferably, (b-2) and (b-3) are alternately performed in (b).

[Supplementary Note 24]

In the method of Supplementary note 23, preferably, exciting the hydrogen-containing gas and exciting the oxygen-containing gas are alternately performed in (b-2).

[Supplementary Note 25]

In the method of Supplementary note 24, preferably, in (b-2), purging is performed between the exciting of the hydrogen-containing gas and the exciting of the oxygen-containing gas.

[Supplementary Note 26]

In the method of any one of Supplementary notes 21 through 25, preferably, a first substrate support and a second substrate support are installed in the process chamber to support the substrate, (a) includes supporting the substrate by the first substrate support and forming the first plasma generating region to generate plasma, and (b) includes supporting the substrate by the second substrate support and forming the second plasma generating region between a back surface of the substrate and the first substrate support.

[Supplementary Note 27]

In the method of any one of Supplementary notes 21 through 26, preferably, the first plasma generating region is formed on a front surface side of the substrate, and the second plasma generating region is formed on a back surface side of the substrate.

[Supplementary Note 28]

In the method of any one of Supplementary notes 21 through 25, preferably, a first substrate support and a second substrate support are installed in the process chamber to support the substrate, wherein the first plasma generating region is formed on the substrate and the second plasma generating region is formed between the substrate supported by the second substrate support and the first substrate support.

[Supplementary Note 29]

According to another aspect of the present invention, there is provided a substrate processing apparatus including:

a process chamber configured to accommodate a substrate;

a first plasma generating region configured to perform a main substrate processing process on the substrate; and a second plasma generating region configured to perform a metal removing process in the process chamber and on the substrate.

[Supplementary Note 30]

The substrate processing apparatus of Supplementary note 29, preferably, further including a first substrate support configured to support the substrate; a second substrate support configured to support the substrate on the first substrate support; and a control unit configured to relatively move the first substrate support and the second substrate support with each other to perform the main substrate processing process by supporting the substrate on the first substrate support and forming the first plasma generating region and to perform the metal removing process by supporting the substrate on the second substrate support and forming the second plasma generating region between a back surface of the substrate and the first substrate support.

[Supplementary Note 31]

The substrate processing apparatus of Supplementary note 29 or 30, preferably, further including:

a gas supply unit configured to supply a process gas containing at least one of a hydrogen-containing gas and an oxygen-containing gas into the substrate;

an excitation unit configured to excite the process gas; and a control unit configured to control the first substrate support, the second substrate support, the gas supply unit and the excitation unit to form the second plasma generating region and supply and excite the process gas in the metal removing process.

[Supplementary Note 32]

The substrate processing apparatus of any one of Supplementary notes 29 through 31, preferably, further including:

an exhaust unit configured to exhaust an atmosphere in the vicinity of the substrate; and a control unit configured to control the gas supply unit, the excitation unit and the exhaust unit to alternately perform the metal removing process and an exhausting process of exhausting the atmosphere in the vicinity of the substrate.

[Supplementary Note 33]

The substrate processing apparatus of any one of Supplementary notes 29 through 31, preferably, further including a control unit configured to control the gas supply unit and the excitation unit to alternately perform a process of exciting a hydrogen-containing gas and a process of exciting an oxygen-containing gas in the metal removing process.

[Supplementary Note 34]

In the substrate processing apparatus of Supplementary note 33, preferably, the control unit controls the gas supply unit, the excitation unit and the exhaust unit to perform a purging process between the process of exciting the hydrogen-containing gas and the process of exciting the oxygen-containing gas.

[Supplementary Note 35]

According to another aspect of the present invention, there is provided a non-transitory computer-readable recording medium having recorded thereon a program for causing a computer to perform a method of manufacturing a semiconductor device, the method including:

(a) generating and processing plasma in a first plasma generating region of a process chamber configured to process a substrate, and (b) forming a second plasma generating region in the process chamber, and generating the plasma in the first plasma generating region and the second plasma generating region.

[Supplementary Note 36]

In the non-transitory computer-readable recording medium of Supplementary note 35, preferably, (b) includes (b-1) supplying a process gas containing at least one of a hydrogen-containing gas and an oxygen-containing gas into the process chamber; (b-2) exciting the process gas supplied into the process chamber; and (b-3) exhausting the inside of the process chamber.

[Supplementary Note 37]

In the non-transitory computer-readable recording medium of Supplementary note 36, preferably, (b-2) and (b-3) are alternately performed in (b).

[Supplementary Note 38]

In the non-transitory computer-readable recording medium of Supplementary note 37, preferably, exciting the hydrogen-containing gas and exciting the oxygen-containing gas are alternately performed in (b-2).

[Supplementary Note 39]

In the non-transitory computer-readable recording medium of Supplementary note 38, preferably, in (b-2), purging is performed between the exciting of the hydrogen-containing gas and the exciting of the oxygen-containing gas.

[Supplementary Note 40]

In the non-transitory computer-readable recording medium of any one of Supplementary notes 35 through 39, preferably, a first substrate support and a second substrate support are installed in the process chamber to support the substrate, (a) includes supporting the substrate by the first substrate support and forming the first plasma generating region to generate plasma, and (b) includes supporting the substrate by the second substrate support and forming the second plasma generating region between a back surface of the substrate and the first substrate support.

[Supplementary Note 41]

In the non-transitory computer-readable recording medium of any one of Supplementary notes 35 through 40, preferably, the first plasma generating region is formed on a front surface side of the substrate, and the second plasma generating region is formed on a back surface side of the substrate.

[Supplementary Note 42]

In the non-transitory computer-readable recording medium of any one of Supplementary notes 35 through 41, preferably, a first substrate support and a second substrate support are installed in the process chamber to support the substrate, wherein the first plasma generating region is formed on the substrate and the second plasma generating region is formed between the substrate supported by the second substrate support and the first substrate support.

According to the present invention, a substrate to be processed may be suppressed from being contaminated with a contaminant generated in a process chamber.

What is claimed is:

1. A method of manufacturing a semiconductor device, comprising:

(a) processing a first substrate placed on a top surface of a susceptor by generating plasma in a first plasma generating region in a process chamber; and (b) removing a metal substance from the susceptor by generating plasma in the first plasma generating region and a second plasma generating region with a second substrate disposed above the top surface of the susceptor such that the metal substance is adhered to a back surface of the second substrate, wherein the second substrate is different from the first substrate, and the second plasma generating region is defined by the back surface of the second substrate and the top surface of the susceptor between the second substrate and the susceptor.

2. The method of claim 1, wherein (b) comprises:

(b-1) supplying at least one gas selected from the group consisting of a hydrogen-containing gas and an oxygen-containing gas into the process chamber;

(b-2) exciting the at least one gas supplied into the process chamber; and (b-3) exhausting an inside of the process chamber.

3. The method of claim 2, wherein (b-1), (b-2) and (b-3) are repeatedly performed a predetermined number of times in (b).

4. The method of claim 2, wherein the hydrogen-containing gas and the oxygen-containing gas are alternately excited in (b-2).

5. The method of claim 4, wherein a purge step is performed between excitation of the hydrogen-containing gas and excitation of the oxygen-containing gas.

6. The method of claim 1, wherein a distance between the top surface of the susceptor and the back surface of the second substrate disposed above the top surface of the susceptor ranges from 0.5 mm to 30 mm.

7. The method of claim 1, wherein plasma is generated at a front surface side of the first substrate in (a), and plasma is generated at a front surface side of the second substrate and at a back surface side of the second substrate in (b).

8. The method of claim 1, wherein the susceptor comprises a substrate placement unit supporting the first substrate.

9. The method of claim 1, wherein the susceptor is made of non-metal material.

10. A non-transitory computer-readable recording medium causing a computer to perform:
 (a) processing a first substrate placed on a top surface of a susceptor by generating plasma in a first plasma generating region in a process chamber; and
 (b) removing a metal substance from the susceptor by generating plasma in the first plasma generating region and a second plasma generating region with a second substrate disposed above the top surface of the susceptor such that the metal substance is adhered to a back surface of the second substrate, wherein the second substrate is different from the first substrate, and the second plasma generating region is defined by the back surface of the second substrate and the top surface of the susceptor between the second substrate and the susceptor.

11. The non-transitory computer-readable recording medium of claim 10, wherein (b) comprises:
 (b-1) supplying at least one gas selected from the group consisting of a hydrogen-containing gas and an oxygen-containing gas into the process chamber;
 (b-2) exciting the at least one gas supplied into the process chamber; and
 (b-3) exhausting an inside of the process chamber.

12. The non-transitory computer-readable recording medium of claim 11, wherein (b-1), (b-2) and (b-3) are repeatedly performed a predetermined number of times in (b).

13. The non-transitory computer-readable recording medium of claim 11, wherein the hydrogen-containing gas and the oxygen-containing gas are alternately excited in (b-2).

14. The non-transitory computer-readable recording medium of claim 13, wherein a purge sequence is performed between excitation of the hydrogen-containing gas and excitation of the oxygen-containing gas.

15. The non-transitory computer-readable recording medium of claim 10, wherein a distance between the top surface of the susceptor and the back surface of the second substrate disposed above the top surface of the susceptor ranges from 0.5 mm to 30 mm.

16. The non-transitory computer-readable recording medium of claim 10, wherein the susceptor comprises a substrate placement unit supporting the first substrate.

* * * * *